United States Patent
Lee et al.

(10) Patent No.: US 11,616,117 B2
(45) Date of Patent: Mar. 28, 2023

(54) DISPLAY APPARATUS

(71) Applicant: Samsung Display Co., Ltd., Yongin-si (KR)

(72) Inventors: Juhyun Lee, Yongin-si (KR); Hyuneok Shin, Yongin-si (KR); Sungjoo Kwon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/507,316

(22) Filed: Oct. 21, 2021

(65) Prior Publication Data

US 2022/0149144 A1 May 12, 2022

(30) Foreign Application Priority Data

Nov. 10, 2020 (KR) .......................... 10-2020-0149600

(51) Int. Cl.
*H01L 27/32* (2006.01)
*H01L 51/52* (2006.01)

(52) U.S. Cl.
CPC ........ *H01L 27/3279* (2013.01); *H01L 27/326* (2013.01); *H01L 27/3234* (2013.01); *H01L 51/5215* (2013.01); *H01L 2251/305* (2013.01); *H01L 2251/308* (2013.01); *H01L 2251/558* (2013.01)

(58) Field of Classification Search
CPC .................................................. H01L 27/3248
See application file for complete search history.

(56) References Cited

U.S. PATENT DOCUMENTS

| | | | |
|---|---|---|---|
| 2006/0091791 | A1 | 5/2006 | Shin |
| 2007/0046999 | A1 | 3/2007 | Shibuya et al. |
| 2011/0309339 | A1* | 12/2011 | You ..................... H01L 51/5265 257/40 |
| 2013/0112975 | A1 | 5/2013 | Choi et al. |

(Continued)

FOREIGN PATENT DOCUMENTS

| | | | |
|---|---|---|---|
| CN | 110288945 A | | 9/2019 |
| CN | 110518034 A | | 11/2019 |

(Continued)

OTHER PUBLICATIONS

EPO Extended European Search Report dated Apr. 4, 2022, issued in corresponding European Patent Application No. 21206175.8 (11 pages).

*Primary Examiner* — Suberr L Chi
(74) *Attorney, Agent, or Firm* — Lewis Roca Rothgerber Christie LLP

(57) ABSTRACT

A display apparatus includes: a substrate comprising a main display area, a component area, and a peripheral area; a main pixel electrode at the main display area of the substrate; a main thin-film transistor at the main display area of the substrate and electrically connected to the main pixel electrode; an auxiliary pixel electrode at the component area of the substrate; an auxiliary thin-film transistor at the peripheral area of the substrate; and a connecting wire connected to the auxiliary pixel electrode and including a thin portion having a thickness less than a thickness of the auxiliary pixel electrode, wherein the connecting wire electrically connects the auxiliary thin-film transistor to the auxiliary pixel electrode.

16 Claims, 16 Drawing Sheets

(56) References Cited

U.S. PATENT DOCUMENTS

2014/0353599 A1* 12/2014 Kang .................. H01L 27/3248
  438/34
2020/0105843 A1   4/2020 Baek et al.
2020/0258967 A1   8/2020 Kim et al.
2021/0408437 A1  12/2021 Du et al.

FOREIGN PATENT DOCUMENTS

| CN | 111129100 A | 5/2020 |
| CN | 210606576 U | 5/2020 |
| KR | 10-2020-0036137 A | 4/2020 |

\* cited by examiner

DISPLAY APPARATUS

CROSS-REFERENCE TO RELATED APPLICATION

The present application claims priority to and the benefit of Korean Patent Application No. 10-2020-0149600, filed on Nov. 10, 2020, in the Korean Intellectual Property Office, the entire disclosure of which is incorporated herein by reference.

BACKGROUND

1. Field

Aspects of some embodiments of the disclosure relate to a display apparatus.

2. Description of Related Art

A display apparatus generally includes a display device and electronic devices for controlling electric signals applied to the display device. The electronic devices may include at least one thin-film transistor (TFT), at least one storage capacitor, and a plurality of wires.

Recently, the various uses of display apparatuses has become more diversified. Also, a thickness and weight of display apparatuses is generally decreasing, and thus the potential range of uses thereof is becoming wider. As the range of uses of display apparatuses has become more diversified, various methods are being studied to design a shape of the display apparatus.

The above information disclosed in this Background section is only for enhancement of understanding of the background and therefore the information discussed in this Background section does not necessarily constitute prior art.

SUMMARY

Aspects of some embodiments of the disclosure relate to a display apparatus, and for example, to a display apparatus in which light transmittance is increased in a partial region.

A general display apparatus does not have high light transmittance in a partial region.

In this regard, the disclosure provides a display apparatus in which light transmittance is increased in a partial region. However, this is only an example and the scope of the disclosure is not limited thereto.

Additional aspects will be set forth in part in the description which follows and, in part, will be apparent from the description, or may be learned by practice of the presented embodiments of the disclosure.

According to some embodiments of the disclosure, a display apparatus includes a substrate including a main display area, a component area, and a peripheral area, a main pixel electrode over the main display area of the substrate, a main thin-film transistor over the main display area of the substrate and electrically connected to the main pixel electrode, an auxiliary pixel electrode over the component area of the substrate, an auxiliary thin-film transistor over the peripheral area of the substrate, and a connecting wire connected to the auxiliary pixel electrode and including a thin portion having a thickness less than a thickness of the auxiliary pixel electrode, wherein the connecting wire electrically connects the auxiliary thin-film transistor to the auxiliary pixel electrode.

According to some embodiments, the thin portion of the connecting wire and the auxiliary pixel electrode may include a same material.

According to some embodiments, the auxiliary pixel electrode may include multiple layers, and the thin portion of the connecting wire and at least one of the multiple layers of the auxiliary pixel electrode may include a same material.

According to some embodiments, the auxiliary pixel electrode may include multiple layers, and the thin portion of the connecting wire and one of the multiple layers of the auxiliary pixel electrode may include a same material.

According to some embodiments, the auxiliary pixel electrode may include multiple layers, and the thin portion of the connecting wire and one of the multiple layers of the auxiliary pixel electrode are integrally formed as a single body.

According to some embodiments, the auxiliary pixel electrode may include multiple layers, and the thin portion of the connecting wire and a lowermost layer of the multiple layers of the auxiliary pixel electrode in a direction to the substrate are integrally formed as a single body.

According to some embodiments, an etch rate of the lowermost layer of the auxiliary pixel electrode may be less than an etch rate of a layer of the auxiliary pixel electrode, the layer being on the lowermost layer.

According to some embodiments, the lowermost layer of the auxiliary pixel electrode may include ITO, IZO, AZO, or GZO, and the layer of the auxiliary pixel electrode on the lowermost layer of the auxiliary pixel electrode may include Ag or Al.

According to some embodiments, the lowermost layer of the auxiliary pixel electrode may include a transparent conductive material, and the layer of the auxiliary pixel electrode on the lowermost layer of the auxiliary pixel electrode may include a metal.

According to some embodiments, the lowermost layer of the auxiliary pixel electrode may include a conductive oxide, and the layer of the auxiliary pixel electrode on the lowermost layer of the auxiliary pixel electrode may include a metal.

According to some embodiments, a thickness of the thin portion of the connecting wire may be less than a thickness of the lowermost layer of the auxiliary pixel electrode.

According to some embodiments, the auxiliary pixel electrode may include the lowermost layer, an intermediate layer on the lowermost layer, and an uppermost layer on the intermediate layer, and a thickness of the lowermost layer may be greater than a thickness of the uppermost layer.

According to some embodiments, the thickness of the lowermost layer may be equal to or greater than 100 Å and less than or equal to 2,000 Å.

According to some embodiments, the uppermost layer and the lowermost layer may include a same material.

According to some embodiments, the thin portion of the connecting wire may extend up to an upper portion of the auxiliary thin-film transistor.

According to some embodiments, the connecting wire may include only the thin portion.

Other aspects, features, and characteristics other than those described above will become more apparent from the detailed descriptions, claims and drawings for carrying out the following disclosure.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1A:
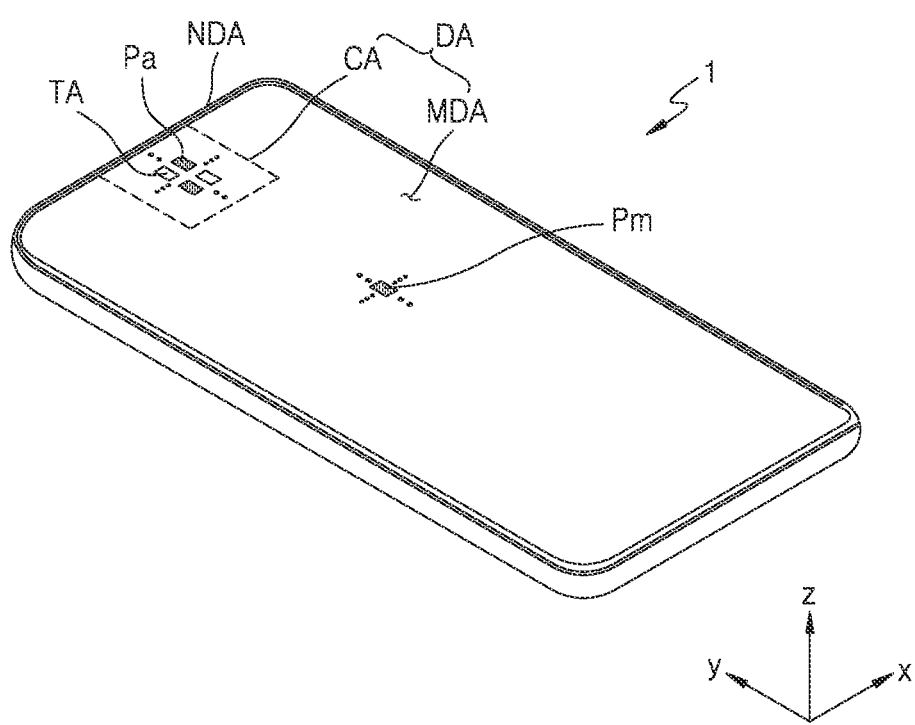
FIGS. 1A through 1C are perspective views schematically showing display apparatuses, according to some embodiments of the disclosure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

One or more embodiments of the disclosure will be described below in more detail with reference to the accompanying drawings. Those components that are the same or are in correspondence with each other are rendered the same reference numeral regardless of the figure number, and redundant explanations are omitted.

It will be understood that when a layer, region, or component is referred to as being "formed on," another layer, region, or component, it can be directly or indirectly formed on the other layer, region, or component. That is, for example, intervening layers, regions, or components may be present. Sizes of elements in the drawings may be exaggerated for convenience of explanation. In other words, because sizes and thicknesses of components in the drawings are arbitrarily illustrated for convenience of explanation, the following embodiments are not limited thereto.

According to some embodiments, an x-axis, a y-axis, and a z-axis are not limited to three axes on an orthogonal coordinate system, but may be interpreted in a broad sense including the three axes. For example, the x-axis, the y-axis, and the z-axis may be perpendicular to one another, or may represent different directions that are not perpendicular to one another.

Figure 1B:
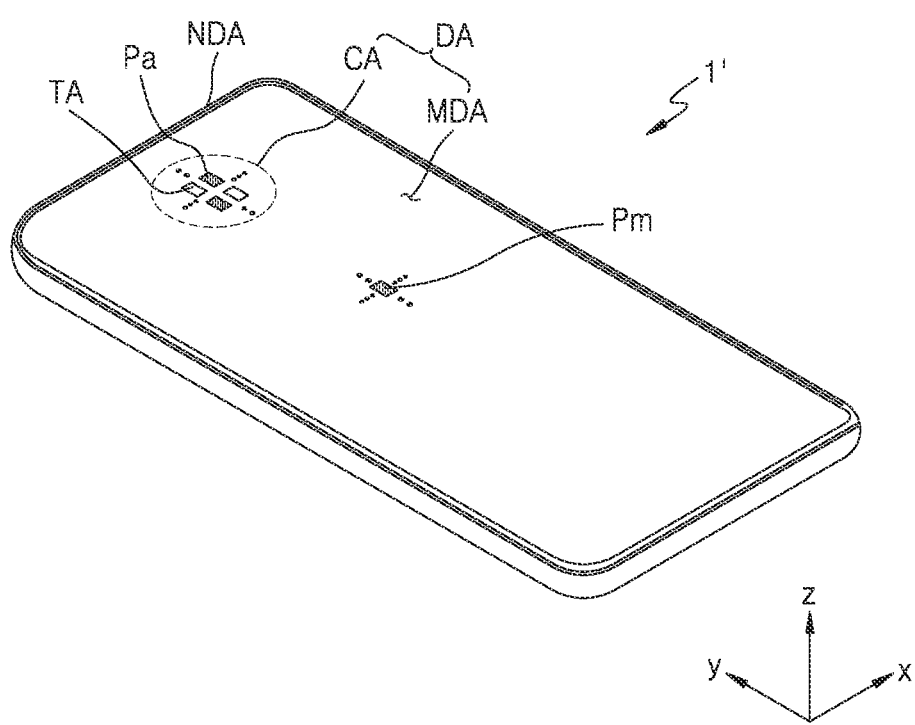
Figure 1C:
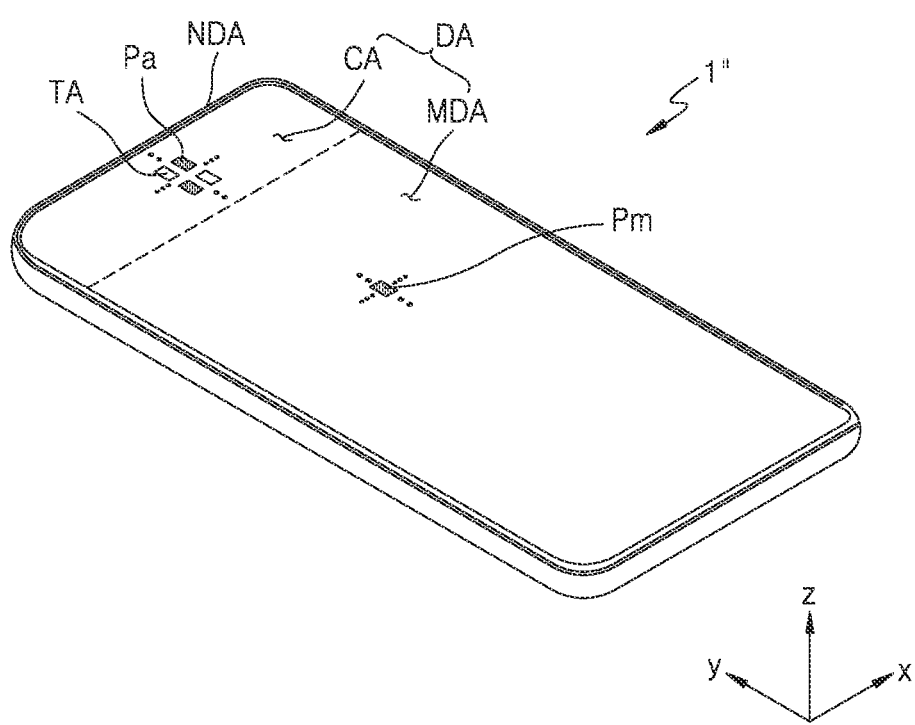

FIGS. 1A through 1C are perspective views schematically showing display apparatuses 1, 1', and 1", according to some embodiments of the disclosure.

As shown in FIG. 1A, the display apparatus 1 includes a display area DA and a peripheral area NDA outside the display area DA. The display area DA includes a component area CA and a main display area MDA at least partially surrounding the component area CA. The component area CA displays auxiliary images and the main display area MDA displays main or primary images. According to some embodiments or instances, the component area CA and the main display area MDA may be configured to display images either individually (e.g., separate and/or distinct images) or together (e.g., as a single cohesive image, where each of the component area CA and the main display area MDA display portions of an image). The peripheral area NDA may be a non-display area where display devices are not arranged. The display area DA may be entirely surrounded by the peripheral area NDA. The display apparatus 1 including the main display area MDA, the component area CA, and the peripheral area NDA may be understood that a substrate included in the display apparatus 1 includes the main display area MDA, the component area CA, and the peripheral area NDA.

In FIG. 1A, the main display area MDA is arranged or formed to surround at least a portion of one component area CA. In other words, one edge of the component area CA may match one edge of the main display area MDA. According to some embodiments, the display apparatus 1 may include two or more component areas CA, and shapes and sizes of the plurality of component areas CA may be different from each other. The component area CA may have any one of various shapes, such as a circular shape, an oval shape, a polygonal shape such as a rectangle, a star shape, or a diamond shape, when viewed in a direction approximately perpendicular to a top surface of the display apparatus 1.

In FIG. 1A, the component area CA is arranged at an upper center (+y direction) of the main display area MDA having an approximately rectangular shape, when viewed in the direction approximately perpendicular to the top surface of the display apparatus 1 (e.g., when viewed in a plan view). However, the disclosure is not limited thereto, and the component area CA may be arranged at one side, for example, an upper right side or upper left side, of the main display area MDA that is rectangular. For example, as shown in FIG. 1B, the component area CA that is circular may be located in the main display area MDA, or as shown in FIG. 1C, the component area CA of a rectangular bar type may be located at one side of the main display area MDA.

The display apparatus 1 may include a plurality of main sub-pixels Pm arranged in the main display area MDA and a plurality of auxiliary sub-pixels Pa arranged in the component area CA.

The display apparatus 1 may include a component 40 (see FIG. 2) that is an electronic device located below a display panel, correspondingly to the component area CA. The component 40 may be an electronic device using light or sound. For example, the electronic device may be a sensor configured to measure a distance, such as a proximity sensor, a sensor configured to recognize a part of a body of a user, such as a fingerprint, an iris, or a face, a small lamp configured to output light, or an image sensor configured to capture an image, such as a camera.

The electronic device using light may use light of various wavelength bands, such as visible light, infrared light, or ultraviolet light. The electronic device using sound may use ultrasonic waves or sound in another frequency band. According to some embodiments, the component 40 may include sub-components, such as a light-emitting unit or a light-receiving unit. The light-emitting unit and the light-receiving unit may have an integrated structure or physically separated structure, and a pair of the light-emitting unit and the light-receiving unit may form one component 40. To improve functionality of the component 40, the component area CA may include a transmissive area TA through which light and/or sound (or other wireless spectrum) externally output from the component 40 or proceeding towards the component 40 from the outside may be transmitted.

In the display apparatus 1 according to some embodiments of the disclosure, light transmittance may be about 10% or more when light is transmitted through the component area CA, and in detail, may be 40% or more, 50% or more, 85% or more, or 90% or more.

The plurality of auxiliary sub-pixels Pa may be arranged in the component area CA. The plurality of auxiliary sub-pixels Pa emit light to provide a certain image. An image displayed in the component area CA is an auxiliary image, and may have lower resolution than an image displayed in the main display area MDA. In other words, the component area CA includes the transmissive area TA through which light and sound are transmitted, and when a sub-pixel is not arranged on the transmissive area TA, a number of auxiliary sub-pixels Pa that may be arranged per unit area may be less than a number of main sub-pixels Pm that may be arranged per unit area on the main display area MDA.

Hereinafter, an organic light-emitting display apparatus will be described as an example of the display apparatus 1 according to some embodiments of the disclosure. However, the display apparatus 1 of the disclosure is not limited thereto. In other words, the display apparatus 1 of the disclosure may be an inorganic light-emitting display or an inorganic EL display, or may be a quantum dot light-emitting display. For example, an emission layer of a display device included in the display apparatus 1 may include an organic material or an inorganic material. Also, the display apparatus 1 may include a quantum dot, an organic material and a quantum dot, or an inorganic material and a quantum dot.

Figure 2:
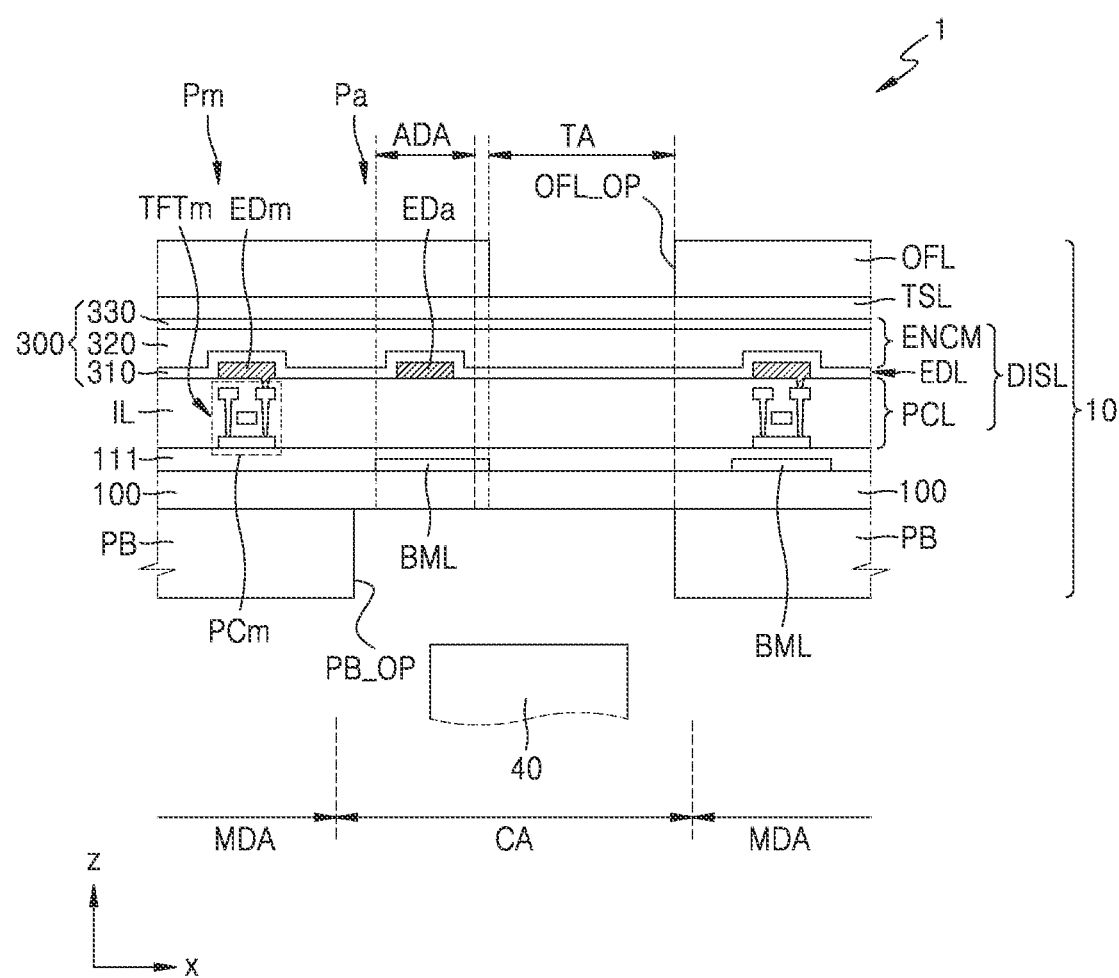
FIG. 2 is a cross-sectional view schematically showing a portion of a cross section of a display apparatus, according to some embodiments of the disclosure.

FIG. 2 is a cross-sectional view schematically showing a portion of a cross section of the display apparatus 1, according to some embodiments of the disclosure. As shown in FIG. 2, the display apparatus 1 may include a display panel 10 and the component 40 arranged to overlap the display panel 10. The display apparatus 1 may further include a cover window arranged over the display panel 10 to protect the display panel 10.

The display panel 10 includes the component area CA that is an area overlapping the component 40, and the main display area MDA where a main image is displayed. The display panel 10 may include a substrate 100, a display layer DISL on the substrate 100, a touch-screen layer TSL, an optical function layer OFL, and a panel protection member PB located below the substrate 100. A buffer layer 111 may be provided between the substrate 100 and the display layer DISL.

The display layer DISL may include a pixel layer PCL, a display device layer EDL, and an encapsulation member ENCM. The pixel layer PCL may include thin-film transistors TFTm and TFTa. The display device layer EDL may include light-emitting elements EDm and EDa, which are display devices. The encapsulation member ENCM may include a thin-film encapsulation layer 300 or an encapsulation substrate. According to some embodiments, an insulating layer IL may be located inside the display layer DISL or the like.

The substrate 100 may include an insulating material, such as glass, quartz, a polymer resin, or the like. The substrate 100 may be a rigid substrate or a flexible substrate capable of bending, folding, or rolling.

The main light-emitting element EDm and main pixel circuit PCm connected thereto may be arranged in the main display area MDA of the display panel 10. The main pixel circuit PCm includes at least one main thin-film transistor TFTm, and may be configured to control operations of the main light-emitting element EDm. The main sub-pixels Pm may include the main light-emitting element EDm.

The auxiliary light-emitting element EDa may be arranged in the component area CA of the display panel 10. The auxiliary light-emitting element EDa is also connected to an auxiliary pixel circuit PCa (see FIG. 3), and the auxiliary pixel circuit PCa may be located in the peripheral area NDA rather than the component area CA. The auxiliary pixel circuit PCa includes at least one thin-film transistor, and may be configured to control operations of the auxiliary light-emitting element EDa. The auxiliary sub-pixels Pa may include the auxiliary light-emitting element EDa.

Among the component area CA, an area where the auxiliary light-emitting element EDa is arranged may be defined as an auxiliary display area ADA, and an area where the auxiliary light-emitting element EDa is not arranged may be defined as the transmissive area TA.

The transmissive area TA may be an area through which light/signal emitted from the component area CA or light/signal incident on the component area CA is transmitted. The auxiliary display area ADA and the transmissive area TA may be arranged alternately in the component area CA.

The display device layer EDL may be covered by the thin-film encapsulation layer 300 as shown in FIG. 2. For example, as shown in FIG. 2, the thin-film encapsulation layer 300 may include at least one inorganic encapsulation layer and at least one organic encapsulation layer. In FIG. 2, the thin-film encapsulation layer 300 includes a first inorganic encapsulation layer 310, a second inorganic encapsulation layer 330, and an organic encapsulation layer 320 therebetween.

The first inorganic encapsulation layer 310 and the second inorganic encapsulation layer 330 may include one or more organic insulating materials, such as silicon oxide ($SiO_2$), silicon nitride $SiN_x$, silicon oxynitride $SiO_xN_y$, aluminum oxide $Al_2O_3$, titanium oxide $TiO_2$, tantalum oxide $Ta_2O_5$, hafnium oxide $HfO_2$, and zinc oxide $ZnO_x$, and may be formed via a chemical vapor deposition (CVD) method. Zinc oxide ZnO may be ZnO or $ZnO_2$. The materials of the first inorganic encapsulation layer 310 and the second inorganic encapsulation layer 330 may be the same or different. The organic encapsulation layer 320 may include a polymer-based material. The polymer-based material may include silicone-based resin, acrylic resin (for example, polymethyl methacrylate or polyacrylic acid), epoxy-based resin, polyimide, or polyethylene. Each of the first inorganic encapsulation layer 310, the organic encapsulation layer 320, and the second inorganic encapsulation layer 330 may be integrally formed as a single body to cover the main display area MDA and component area CA.

However, the disclosure is not limited thereto, and the display panel 10 may include an encapsulation substrate located on the upper portion of the display device layer EDL. In this case, the encapsulation substrate may be arranged to face the substrate 100 with the display device layer EDL therebetween. A gap may be present between the encapsulation substrate and the display device layer EDL. The encapsulation substrate may include glass. A sealant formed of frit or the like may be formed between the substrate 100 and the encapsulation substrate, and the sealant may be arranged in the peripheral area NDA described above. The sealant arranged in the peripheral area NDA may surround the display area DA and prevent or reduce instances of moisture or other contaminants penetrating from a side surface.

The touch-screen layer TSL may obtain coordinate information according to an external input, for example, a touch event. The touch-screen layer TSL may include a touch electrode and touch wires connected to the touch electrode. The touch-screen layer TSL may detect the external input via a magnetic capacitance method or a mutual capacitance method.

The touch-screen layer TSL may be located on the thin-film encapsulation layer 300. Alternatively, the touch-screen layer TSL may be formed separately on the touch substrate and then combined on the thin-film encapsulation layer 300 via an adhesive layer, such as an optical clear adhesive OCA. According to some embodiments, the touch-screen layer TSL may be directly formed on the thin-film encapsulation layer 300, and in this case, the adhesive layer may not be provided between the touch-screen layer TSL and the thin-film encapsulation layer 300.

The optical function layer OFL may include a reflection preventing layer. The reflection preventing layer may reduce reflectance of light (external light) incident from the outside towards the display apparatus 1. For example, the optical function layer OFL may be a polarizing film. The optical function layer OFL may include an opening OFL_OP corresponding to the transmissive area TA. Accordingly, light transmittance of the transmissive area TA may significantly increase. The opening OFL_OP may be filled with a transparent material, such as optically clear resin (OCR). Alternatively, the optical function layer OFL may be implemented as a filter plate including black matrix and color filters.

The panel protection member PB may be attached below the substrate 100 to support and protect the substrate 100. The panel protection member PB may include an opening PB_OP corresponding to the component area CA. The panel protection member PB includes the opening PB_OP and thus light transmittance in the component area CA may be increased. The panel protection member PB may include polyethylene terephthalate or polyimide.

An area of the component area CA may be greater than an area where the component 40 is arranged. Accordingly, an area of the opening PB_OP included in the panel protection member PB may not match the area of the component area CA. In FIG. 2, the component 40 is spaced apart from the display panel 10 at one side (−z direction) of the display panel 10, but at least a portion of the component 40 may be inserted into the opening PB_OP included in the panel protection member PB.

Also, a plurality of components 40 may be arranged in the component area CA. In this case, the components 40 may have different functions. For example, the components 40 may include at least two of a camera (imaging device), a solar cell, a flash, a proximity sensor, an illuminance sensor, and an iris sensor.

Figure 3:
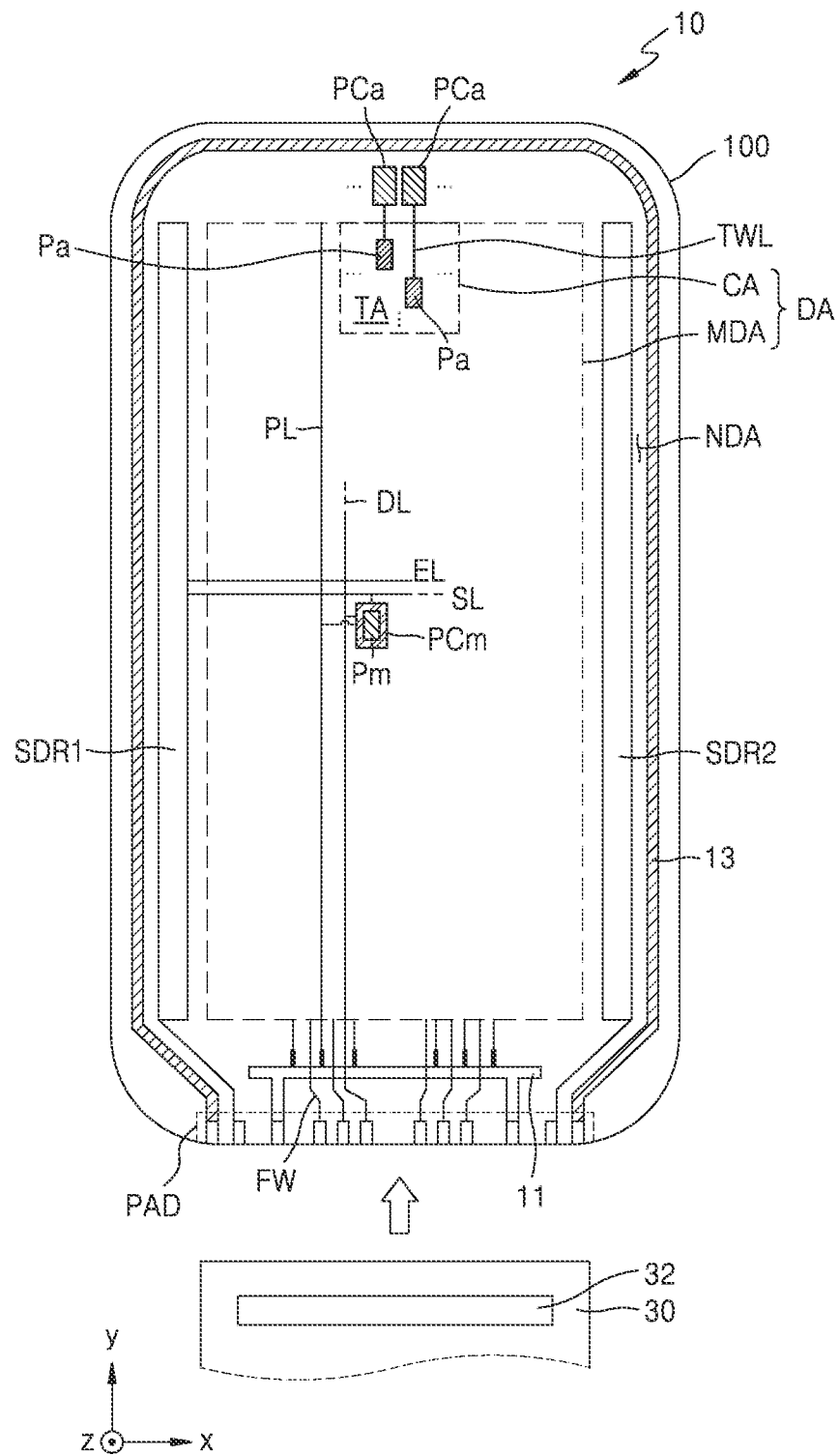
FIG. 3 is a plan view schematically showing a display panel that may be included in the display apparatus of FIG. 1B.

FIG. 3 is a plan view schematically showing the display panel 10 that may be included in one of the display apparatuses 1, 1', and 1" described above. In particular, FIG. 3 may be understood to be a plan view schematically showing the display panel 10 that may be included in the display apparatus 1' of FIG. 1B. Referring to FIG. 3, various components forming the display panel 10 are arranged over the substrate 100.

The plurality of main sub-pixels Pm are arranged in the main display area MDA. Each of the main sub-pixels Pm may be implemented by a display device, such as an organic light-emitting diode (OLED). The main pixel circuit PCm configured to drive the main sub-pixels Pm may be arranged in the main display area MDA and may overlap the main sub-pixels Pm. Each of the main sub-pixels Pm may emit, for example, red, green, blue, or white light. The main display area MDA is covered by a sealing member to be protected from external air, moisture, or the like.

As described above, the component area CA may be located at one side of the main display area MDA or may be arranged inside the display area DA to be surrounded by the main display area MDA. The plurality of auxiliary sub-pixels Pa are arranged in the component area CA. Each of the auxiliary sub-pixels Pa may be implemented by a display device, such as an organic light-emitting diode (OLED). The auxiliary pixel circuit PCa electrically connected to the auxiliary sub-pixels Pa located in the component area CA may be arranged in the peripheral area NDA. Each of the auxiliary sub-pixels Pa may emit, for example, red, green, blue, or white light. The component area CA may be covered by the sealing member together with the main display area MDA to be protected from external air, moisture, or the like.

The auxiliary pixel circuit PCa configured to drive the plurality of auxiliary sub-pixels Pa of the component area CA may be arranged in the peripheral area NDA adjacent to the component area CA. As shown in FIG. 3, when the component area CA is arranged above (+y direction) of the display area DA, the auxiliary pixel circuit PCa may be arranged in an upper peripheral area of the peripheral area NDA. The display device implementing the auxiliary pixel circuit PCa and the auxiliary sub-pixels Pa may be connected to a connecting wire TWL extending in one direction (for example, y direction). In FIG. 3, the auxiliary pixel circuit PCa is located immediately above the component area CA, but the disclosure is not limited thereto. Various modifications are possible, for example, the auxiliary pixel circuit PCa may be located at left (−x direction) or right (+x direction) of the main display area MDA.

Meanwhile, as described above, the component area CA may include the transmissive area TA. The transmissive area TA may be arranged to surround the plurality of auxiliary sub-pixels Pa. Alternatively, the transmissive area TA may be arranged in a lattice form with the plurality of auxiliary sub-pixels Pa. Because the component area CA includes the transmissive area TA, a resolution of the component area CA may be lower than a resolution of the main display area MDA. For example, the resolution of the component area CA may be about ½, ⅜, ⅓, ¼, 2/9, ⅛, 1/9, or 1/16 of the resolution of the main display area MDA. For example, the resolution of the main display area MDA may be about 400 ppi or greater, and the resolution of the component area CA may be about 200 ppi or 100 ppi.

The main and auxiliary pixel circuits PCm and PCa configured to drive the main and auxiliary sub-pixels Pm and Pa may be electrically connected to outer circuits arranged in the peripheral area NDA. A first scan driving circuit SDR1, a second scan driving circuit SDR2, a terminal portion PAD, a driving voltage supply line 11, and a common voltage supply line 13 may be arranged in the peripheral area NDA.

The first scan driving circuit SDR1 and the second scan driving circuit SDR2 may be arranged symmetrically based on the main display area MDA. The first scan driving circuit SDR1 and the second scan driving circuit SDR2 may apply a scan signal to the main pixel circuit PCm configured to drive the main sub-pixels Pm via a scan line SL. Also, the first scan driving circuit SDR1 and the second scan driving circuit SDR2 may apply an emission control signal to each pixel circuit (e.g., the main pixel circuit PCm and the auxiliary pixel circuit PCa) via an emission control line EL. A part of the main pixel circuit PCm of the main sub-pixels Pm of the main display area MDA may be electrically connected to the first scan driving circuit SDR1 and the remaining thereof may be electrically connected to the second scan driving circuit SDR2.

The terminal portion PAD may be arranged at one side of the substrate 100. The terminal portion PAD may not be covered by an insulating layer, but may be exposed to be electrically connected to a display circuit board 30. A display driving unit 32 may be arranged in the display circuit board 30.

The display driving unit 32 may be configured to generate a control signal transmitted to the first scan driving circuit SDR1 and the second scan driving circuit SDR2. The display driving unit 32 is configured to generate a data signal, and the generated data signal may be transmitted to the main pixel circuit PCm via a fanout wire FW and a data line DL connected to the fanout wire FW.

The display driving unit 32 may be configured to supply a driving voltage ELVDD to the driving voltage supply line 11 and supply a common voltage ELVSS to the common voltage supply line 13. The driving voltage ELVDD is applied to the main and auxiliary pixel circuits PCm and PCa of the main and auxiliary sub-pixels Pm and Pa via a driving voltage line PL connected to the driving voltage supply line 11, and the common voltage ELVSS may be applied to an opposing electrode of the display device (e.g., the display device included in the main auxiliary sub-pixel Pm or the display device included in auxiliary sub-pixel Pa) via the common voltage supply line 13.

The driving voltage supply line 11 may extend in an x direction below the main display area MDA. The common voltage supply line 13 may partially surround the main display area MDA by having a shape in which one side is opened from a loop shape.

In FIG. 3, one component area CA is illustrated, but the display panel 10 may include a plurality of component areas CA. In this case, the plurality of component areas CA are spaced apart from each other, wherein a first camera may be arranged in one component area CA and a second camera may be arranged in another component area CA. Alternatively, a camera may be arranged in one component area CA and an infrared sensor may be arranged in another component area CA. Shapes and sizes of the plurality of component areas CA may be different from each other.

Figure 4:
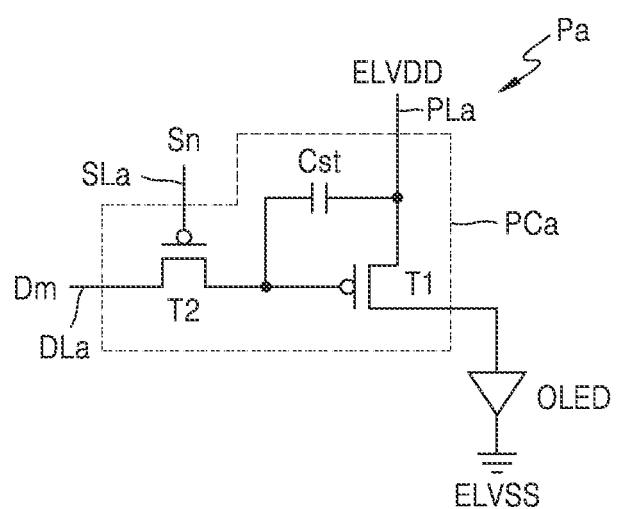
FIG. 4 is an equivalent circuit diagram of a pixel circuit that may be included in the display apparatuses of FIGS. 1A through 1C.

FIG. 4 is an equivalent circuit diagram of a pixel circuit that may be included in the display apparatuses 1 through 1" of FIGS. 1A through 1C. As shown in FIG. 4, the auxiliary sub-pixels Pa includes the auxiliary pixel circuit PCa and an organic light-emitting diode OLED as a display device connected to the auxiliary pixel circuit PCa. The auxiliary sub-pixels Pa may also include the main pixel circuit PCm same/similar to the auxiliary pixel circuit PCa as shown in FIG. 4, and the organic light-emitting diode OLED as a display device connected thereto.

As shown in FIG. 4, the auxiliary pixel circuit PCa includes a driving thin-film transistor T1, a switching thin-film transistor T2, and a storage capacitor Cst. The switching thin-film transistor T2 is connected to an auxiliary scan line SLa and an auxiliary data line DLa, and is configured to transmit a data signal Dm input via the auxiliary data line DLa to the driving thin-film transistor T1, according to a scan line Sn input via the auxiliary scan line SLa. The storage capacitor Cst is connected to the switching thin-film transistor T2 and an auxiliary driving voltage line PLa, and is configured to store a voltage corresponding to a difference between a voltage received from the switching thin-film transistor T2 and the driving voltage ELVDD supplied to the auxiliary driving voltage line PLa.

The driving thin-film transistor T1 is connected to the auxiliary driving voltage line PLa and the storage capacitor Cst, and is configured to control a driving current flowing through the organic light-emitting diode OLED from the auxiliary driving voltage line PLa in response to a voltage value stored in the storage capacitor Cst. The organic light-emitting diode OLED may emit a light of a certain luminance according to the driving current.

In FIG. 4, the auxiliary pixel circuit PCa includes two thin-film transistors and one storage capacitor, but embodiments according to the present disclosure are not limited thereto. According to some embodiments, the auxiliary pixel circuit PCa may include seven thin-film transistors and one storage capacitor. According to some embodiments, the auxiliary pixel circuit PCa may include two or more storage capacitors.

Figure 5:
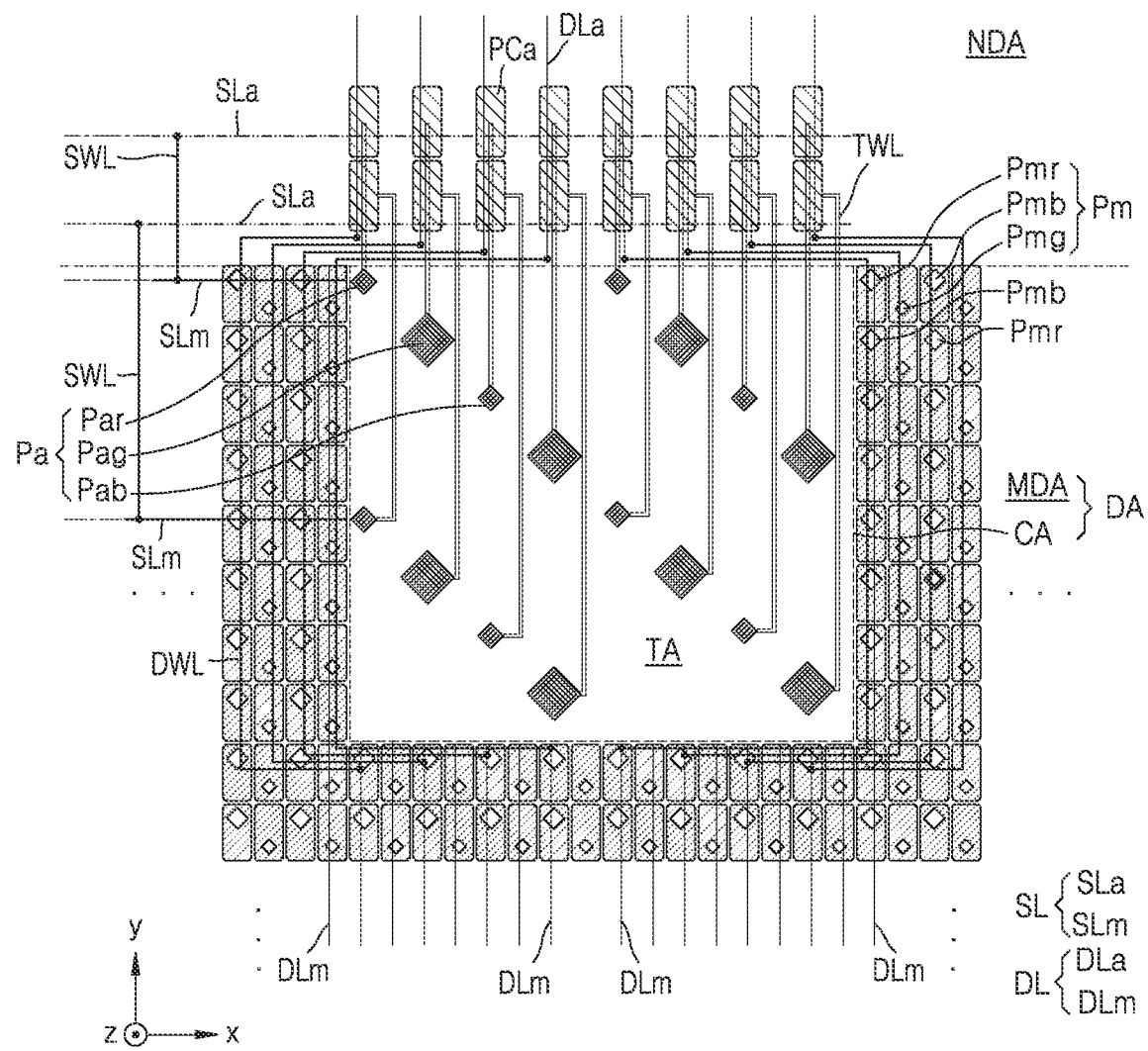
FIG. 5 is a plan layout view schematically showing a partial region of a display apparatus, according to some embodiments of the disclosure.

FIG. 5 is a plan layout view schematically showing a partial region of a display apparatus, according to some embodiments of the disclosure. In particular, FIG. 5 illustrates the component area CA and portions of the main display area MDA and peripheral area NDA adjacent thereto.

Referring to FIG. 5, the plurality of main sub-pixels Pm may be arranged in the main display area MDA. Here, a sub-pixel is a smallest unit realizing an image and denotes an emission area that emits light by a display device. When an organic light-emitting diode is employed as the display device, the emission area may be defined by an opening of a pixel-defining layer. This has been described above. Each of the plurality of main sub-pixels Pm may emit any one of red, green, blue, and white lights.

The main sub-pixels Pm arranged in the main display area MDA may include a first sub-pixel Pmr, a second sub-pixel Pmg, and a third sub-pixel Pmb. The first sub-pixel Pmr, the second sub-pixel Pmg, and the third sub-pixel Pmb may realize red, green, and blue, respectively. The main sub-pixels Pm may be arranged in a pentile structure.

For example, the first sub-pixels Pmr may be arranged at first and third vertices facing each other from among vertices of a virtual rectangle in which a center point of the second sub-pixel Pmg is a center point of the rectangle, and the third sub-pixels Pmb may be arranged at second and fourth vertices that are the remaining vertices. According to some embodiments, a size (i.e., an emission area) of the second sub-pixel Pmg may be smaller than a size (i.e., an emission area) of the first sub-pixel Pmr and a size (i.e., an emission area) of the third sub-pixel Pmb.

Such a pixel arrangement structure is referred to as a pentile matrix structure or pentile structure, and high resolution may be realized with a small number of pixels by applying rendering expressing a color by sharing adjacent pixels.

In FIG. 5, the plurality of main sub-pixels Pm are arranged in a pentile matrix structure, but the disclosure is not limited thereto. For example, the plurality of main sub-pixels Pm may be arranged in various shapes, such as a stripe structure, a mosaic arrangement structure, and a delta arrangement structure.

In the main display area MDA, the main pixel circuits PCm may overlap the main sub-pixels Pm, and the main pixel circuits PCm may be arranged in a matrix form along x and y directions. In the current specification, the main pixel circuit PCm may denote a unit of pixel circuit implementing one main sub-pixel Pm.

The plurality of auxiliary sub-pixels Pa may be arranged in the component area CA. Each of the plurality of auxiliary sub-pixels Pa may emit any one of red, green, blue, and white lights. The auxiliary sub-pixels Pa may include a first sub-pixel Par, a second sub-pixel Pag, and a third sub-pixel Pab, which exhibit different colors. The first sub-pixel Par, the second sub-pixel Pag, and the third sub-pixel Pab may respectively realize red, green, and blue.

The number of auxiliary sub-pixels Pa arranged in the component area CA per unit area may be less than the number of main sub-pixels Pm arranged in the main display area MDA per unit area. For example, a ratio of the number of auxiliary sub-pixels Pa per unit area and the number of main sub-pixels Pm per unit area may be 1:2, 1:4, 1:8, or 1:9. In other words, the resolution of the component area CA may be ½, ¼, ⅛, or ⅑ of the resolution of the main display area MDA. In FIG. 5, the resolution of the component area CA is ⅛.

The auxiliary sub-pixels Pa arranged in the component area CA may be arranged in various shapes. Some of the auxiliary sub-pixels Pa may gather to form a pixel group and may be arranged in various structure, such as a pentile structure, a stripe structure, a mosaic arrangement structure, and a delta arrangement structure, in the pixel group. Here, a distance between the auxiliary sub-pixels Pa arranged in the pixel group may be the same as a distance between the main sub-pixels Pm.

Alternatively, as shown in FIG. 5, the auxiliary sub-pixels Pa may be distributed in the component area CA. In other words, the distance between auxiliary sub-pixels Pa may be greater than the distance between main sub-pixels Pm. Meanwhile, an area of the component area CA where the auxiliary sub-pixels Pa are not arranged may be referred to as the transmissive area TA having high light transmittance, as described above.

The auxiliary pixel circuits PCa realizing emission of the auxiliary sub-pixels Pa may be arranged in the peripheral area NDA. The auxiliary pixel circuits PCa are not arranged in the component area CA, and thus the transmissive area TA larger than the component area CA may be secured.

The auxiliary pixel circuits PCa may be connected to the auxiliary sub-pixels Pa via the connecting wires TWL. Accordingly, when a length of the connecting wire TWL is increased, an RC delay phenomenon may occur, and thus the auxiliary pixel circuits PCa may be arranged considering lengths of the connecting wires TWL.

According to some embodiments, the auxiliary pixel circuits PCa may be arranged on an extending line connecting the auxiliary sub-pixels Pa arranged along a y direction. Also, the auxiliary pixel circuits PCa may be arranged along the y direction as much as the number of auxiliary sub-pixels Pa arranged along the y direction. For example, as shown in FIG. 5, when two auxiliary sub-pixels Pa are arranged along the y direction in the component area CA, two auxiliary pixel circuits PCa may be arranged along the y direction in the upper peripheral area of the peripheral area NDA.

The connecting wires TWL may extend in the y direction to connect the auxiliary sub-pixels Pa and the auxiliary pixel circuits PCa to each other. When the connecting wire TWL is connected to the auxiliary sub-pixel Pa, the connecting wire TWL may be electrically connected to a pixel circuit of a display device implementing the auxiliary sub-pixel Pa.

The scan line SL may include a main scan line SLm connected to the main pixel circuit PCm, and the auxiliary scan line SLa connected to the auxiliary pixel circuit PCa. The main scan line SLm may extend in an x direction to be connected to the main pixel circuits PCm arranged in a same row. The main scan line SLm may not be arranged in the component area CA. In other words, the main scan line SLm may be disconnected in the component area CA between a left of the component area CA and a right of the component area CA. In this case, the main scan line SLm arranged at the left of the component area CA may receive a signal from the first scan driving circuit SDR1 of FIG. 3 and the main scan line SLm arranged at the right of the component area CA may receive a signal from the second scan driving circuit SDR2 of FIG. 3.

The auxiliary scan line SLa may extend in the x direction to be connected to the auxiliary pixel circuits PCa arranged in a same row. The auxiliary scan line SLa may be arranged on the upper peripheral area of the peripheral area NDA.

The main scan line SLm and the auxiliary scan line SLa are connected via a scan connecting line SWL, and thus a same signal may be applied to the main and auxiliary pixel circuits PCm and PCa configured to drive the main sub-pixels Pm and auxiliary sub-pixels Pa arranged in a same row. The scan connecting line SWL may be arranged on a layer different from the main scan line SLm and auxiliary scan line SLa, and may be connected to each of the main scan line SLm and auxiliary scan line SLa via contact holes. The scan connecting line SWL may be arranged in the upper peripheral area of the peripheral area NDA.

The data line DL may include a main data line DLm connected to the main pixel circuits PCm and the auxiliary data line DLa connected to the auxiliary pixel circuits PCa. The main data line DLm may extend in the y direction to be connected to the main pixel circuits PCm arranged in a same column. The auxiliary data line DLa may extend in the y direction to be connected to the auxiliary pixel circuits PCa arranged in a same column.

The main data line DLm and the auxiliary data line DLa may be spaced apart from each other with the component area CA therebetween. The main data line DLm and the auxiliary data line DLa may be connected to a data connecting line DWL, and a same signal may be applied to the main and auxiliary pixel circuits PCm and PCa configured to drive the main sub-pixels Pm and auxiliary sub-pixels Pa arranged in a same column.

The data connecting line DWL may be arranged to bypass the component area CA. According to some embodiments, the data connecting line DWL may overlap the main pixel circuits PCm arranged in the main display area MDA. When the data connecting line DWL is arranged in the main display area MDA, it is not required to secure a separate space where the data connecting line DWL is arranged, and thus an area of a dead space may be reduced.

According to some embodiments, the data connecting line DWL may be arranged in an intermediate area between the main display area MDA and the component area CA.

The data connecting line DWL may be arranged in a layer different from the main data line DLm and auxiliary data line DLa, and may be connected to each of the main data line DLm and auxiliary data line DLa via contact holes.

Figure 6:
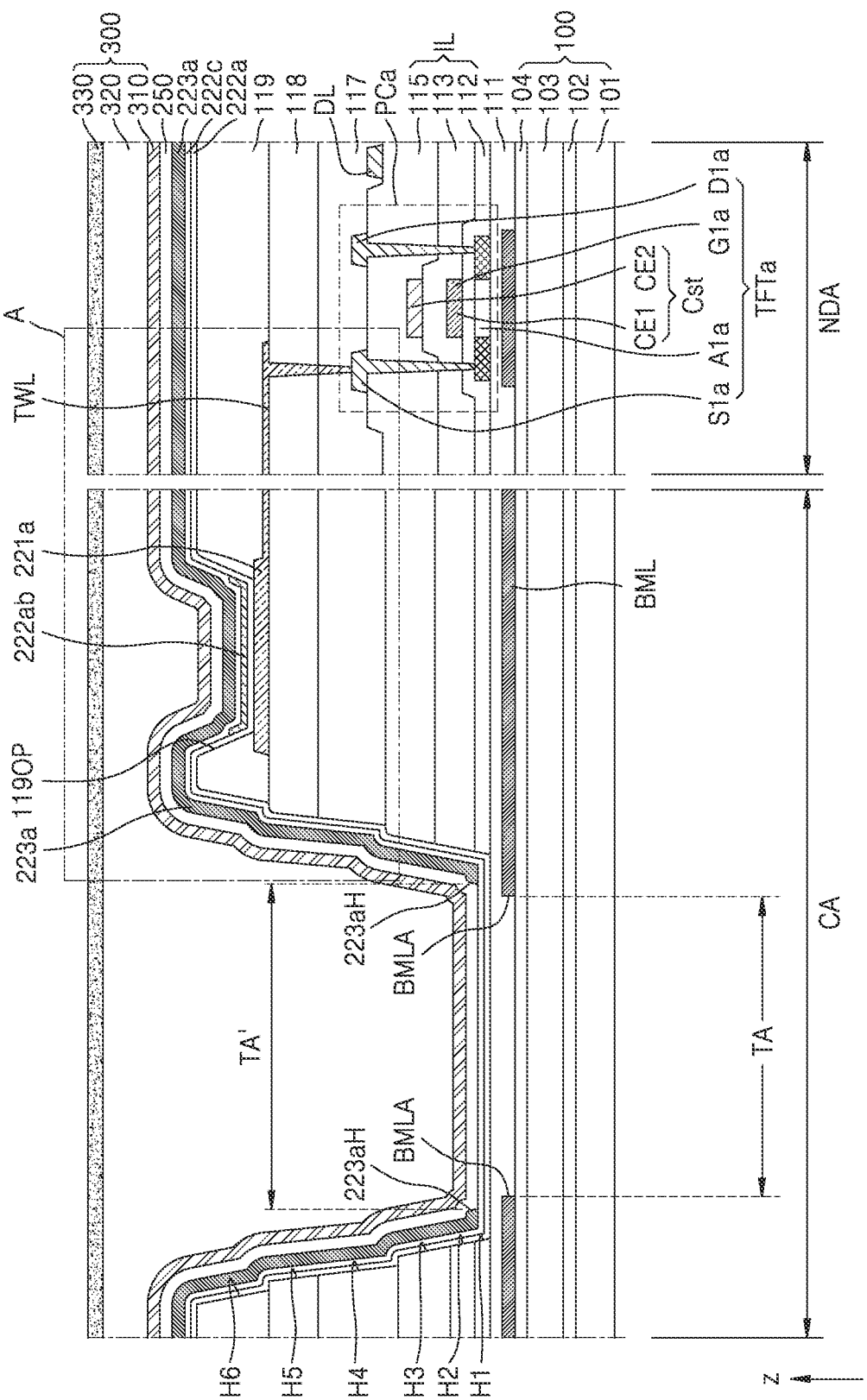
FIG. 6 is a cross-sectional view schematically showing a portion of the structure of FIG. 5.
Figure 7:
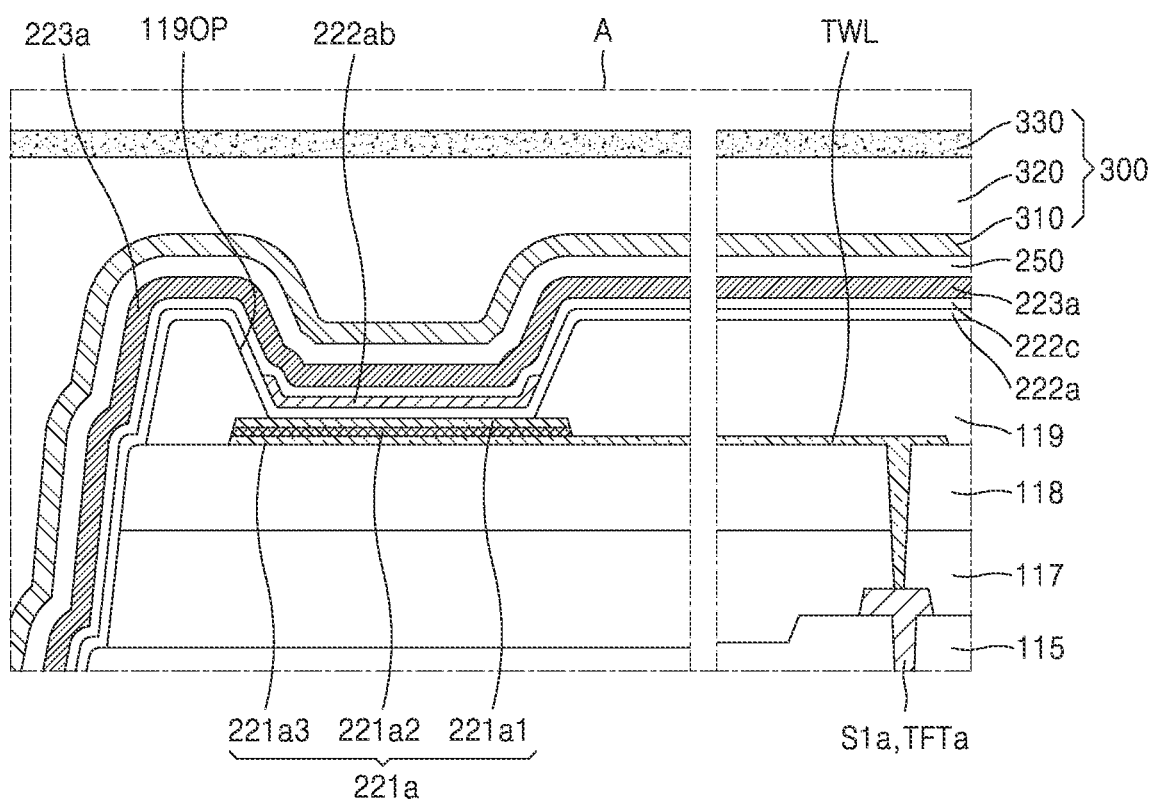
FIG. 7 is a cross-sectional view schematically showing a portion A of FIG. 6.

FIG. 6 is a cross-sectional view schematically showing a portion of the structure of FIG. 5. FIG. 6 illustrates a portion of the component area CA and a portion of the peripheral area NDA. FIG. 7 is a cross-sectional view schematically showing a portion A of FIG. 6.

The substrate 100 may include various materials, and as shown in FIG. 6, may include a multilayer structure. For example, the substrate 100 may include a first base layer 101, a first inorganic layer 102, a second base layer 103, and a second inorganic layer 104, which are sequentially stacked.

The first base layer 101 and the second base layer 103 may each include a polymer resin. The polymer resin may include polyether sulfone, polyarylate, polyetherimide, polyethylene naphthalate, polyethylene terephthalate, polyphenylene sulfide, polyimide, polycarbonate, cellulose triacetate, or cellulose acetate propionate. The polymer resin may be transparent.

The first inorganic layer 102 and the second inorganic layer 104 may be barrier layers preventing or reducing penetration of a foreign substance. Each of the first inorganic layer 102 and the second inorganic layer 104 may be a single layer or multiple layers including an inorganic material, such as silicon nitride, silicon oxynitride, and/or silicon oxide.

The buffer layer 111 may reduce or block the penetration of foreign materials, moisture, or ambient air from a bottom portion of the substrate 100 and may planarize a top surface of the substrate 100. The buffer layer 111 may include an inorganic insulating material, such as silicon oxide, silicon oxynitride, or silicon nitride, and may have a single layer or multilayer structure including such a material.

The auxiliary pixel circuit PCa including an auxiliary thin-film transistor TFTa and the storage capacitor Cst, which are located in the peripheral area NDA, may be located over the buffer layer 111. According to some embodiments, the main pixel circuit PCm may be arranged in the main display area MDA. The main pixel circuit PCm of the main display area MDA and the auxiliary pixel circuit PCa of the peripheral area NDA may have a same structure.

A rear metal layer BML may be located between the substrate 100 and the auxiliary light-emitting element EDa arranged in the component area CA. The rear metal layer BML may prevent light emitted from the component 40 or transmitted towards the component 40 from being diffracted through a narrow gap between wires in the component area CA, or the rear metal layer BML may reduce the degree of diffraction of light emitted from the component 40 or transmitted towards the component 40. The rear metal layer BML is not present in the transmissive area TA. For example, the rear metal layer BML may include opening portions BMLA corresponding to the transmissive area TA. In other words, the opening portions BMLA of the rear metal layer BML may define the transmissive area TA of the component area CA.

When required, the rear metal layer BML may be located in the main display area MDA to increase a performance of the main thin-film transistor TFTm of the main pixel circuit PCm. In this case, the rear metal layer BML is located below a main semiconductor layer of the main thin-film transistor TFTm.

The auxiliary thin-film transistor TFTa of the auxiliary pixel circuit PCa located in the peripheral area NDA may include an auxiliary semiconductor layer A1a, an auxiliary gate electrode G1a overlapping a channel region of the auxiliary semiconductor layer A1a, and a source electrode S1a and drain electrode D1a respectively connected to a source region and drain region of the auxiliary semiconductor layer A1a. A gate insulating layer 112 may be provided between the auxiliary semiconductor layer A1a and the auxiliary gate electrode G1a, and a first interlayer insulating layer 113 and a second interlayer insulating layer 115 may be provided between the auxiliary gate electrode G1a and the source electrode S1a or between the auxiliary gate electrode G1a and the drain electrode D1a.

The storage capacitor Cst may overlap a thin-film transistor. The storage capacitor Cst may include a first capacitor plate CE1 and a second capacitor plate CE2 that overlap each other. According to some embodiments, the auxiliary gate electrode G1a of the auxiliary thin-film transistor TFTa and the first capacitor plate CE1 of the storage capacitor Cst may be integrally formed as a single body. The first interlayer insulating layer 113 may be between the first capacitor plate CE1 and the second capacitor plate CE2.

The auxiliary semiconductor layer A1a may include polysilicon. According to some embodiments, the auxiliary semiconductor layer A1a may include amorphous silicon. According to some embodiments, the auxiliary semiconductor layer A1a may include an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). The auxiliary semiconductor layer A1a may include the channel region, and the source region and drain region where impurities are doped.

The gate insulating layer 112 may include an inorganic insulating material, such as silicon oxide, silicon oxynitride, or silicon nitride, and may have a single layer or multilayer structure including such a material.

The auxiliary gate electrode G1a may include a low-resistance conductive material such as molybdenum (Mo), aluminum (Al), copper (Cu), and/or titanium (Ti), and may have a single layer or multilayer structure including such a material. For example, the auxiliary gate electrode G1a may have a three-layer structure of a molybdenum layer/aluminum layer/molybdenum layer.

The first interlayer insulating layer 113 may include an inorganic insulating material, such as silicon oxide, silicon oxynitride, or silicon nitride, and may have a single layer or multilayer structure including such a material.

The second capacitor plate CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single layer or multilayer structure including such a material.

The second interlayer insulating layer 115 may include an inorganic insulating material, such as silicon oxide, silicon oxynitride, or silicon nitride, and may have a single layer or multilayer structure including such a material.

The source electrode S1a or drain electrode D1a may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single layer or multilayer structure including such a material. For example, the source electrode S1a or drain electrode D1a may have a three-layer structure of titanium layer/aluminum layer/titanium layer.

The auxiliary pixel circuit PCa including the auxiliary thin-film transistor TFTa and storage capacitor Cst may be electrically connected to an auxiliary pixel electrode 221a located on the component area CA. For example, as shown in FIG. 6, the auxiliary pixel circuit PCa and the auxiliary pixel electrode 221a may be electrically connected via the connecting wire TWL. In FIG. 6, the connecting wire TWL electrically connects the auxiliary pixel electrode 221a and source electrode S1a of the auxiliary pixel circuit PCa, but the disclosure is not limited thereto. Various modifications are possible, for example, the connecting wire TWL may electrically connect the auxiliary pixel electrode 221a and the drain electrode D1a of the auxiliary pixel circuit PCa.

A first planarization layer 117 covering the auxiliary thin-film transistor TFTa may include an organic insulating material. The first planarization layer 117 may include the organic insulating material such as acryl, benzo cyclobutene (BCB), polyimide, or hexamethyldisiloxane (HMDSO). The organic insulating material of the first planarization layer 117 may be a photosensitive organic insulating material.

A second planarization layer 118 on the first planarization layer 117 may include an organic insulating material. The second planarization layer 118 may include the organic insulating material such as acryl, benzo cyclobutene (BCB), polyimide, or hexamethyldisiloxane (HMDSO). The organic insulating material of the second planarization layer 118 may be a photosensitive organic insulating material. A wire may be located between the first planarization layer 117 and the second planarization layer 118 when required.

The auxiliary pixel electrode 221a may be located on the second planarization layer 118. The auxiliary pixel electrode 221a may be electrically connected to the auxiliary thin-film transistor TFTa via the connecting wire TWL.

The auxiliary pixel electrode 221a may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. The auxiliary pixel electrode 221a may include the reflective layer including such a material and a transparent conductive layer on and/or below the reflective layer. The transparent conductive layer may include indium tin oxide (ITO), indium zinc oxide (IZO), zinc oxide (ZnO), indium oxide ($In_2O_3$), indium gallium oxide (IGO), or aluminum zinc oxide (AZO).

According to some embodiments, the auxiliary pixel electrode 221a may have a three-layer structure of ITO layer/Ag layer/ITO layer that are sequentially stacked. In this case, the ITO layer that is an uppermost layer may decrease an energy level difference between the auxiliary pixel electrode 221a and a first functional layer 222a, the Ag layer that is an intermediate layer may allow the auxiliary pixel electrode 221a to operate as a reflective electrode, and the ITO layer that is a lowermost layer may prevent Ag of the intermediate layer from spreading therebelow, or reduce the instances of spreading of Ag of the intermediate layer.

Hereinabove, the auxiliary pixel electrode 221a located in the component area CA and the auxiliary pixel circuit PCa located in the peripheral area NDA have been described, and the same explanation may be applied to a main pixel electrode and the main pixel circuit PCm located in the main display area MDA. In other words, the main thin-film transistor TFTm of the main pixel circuit PCm located in the main display area MDA may have a same/similar structure as the auxiliary thin-film transistor TFTa of the auxiliary pixel circuit PCa located in the peripheral area NDA, and the main pixel electrode located in the main display area MDA may have a same/similar structure as the auxiliary pixel electrode 221a of the component area CA. However, the main pixel electrode may be located at an upper portion of the main pixel circuit PCm to be electrically connected to the main pixel circuit PCm located therebelow.

A pixel-defining layer 119 may be located on the main pixel electrode and the auxiliary pixel electrode 221a. The pixel-defining layer 119 covers edges of the main pixel electrode and the auxiliary pixel electrode 221a, and may include an opening 1190P overlapping a center portion of each of the main pixel electrode and the auxiliary pixel electrode 221a. The pixel-defining layer 119 may include an organic insulating material, such as polyimide, polyamide, acryl resin, benzo cyclobutene, HMDSO, or phenol resin.

The first functional layer 222a and a second functional layer 222c are located on the pixel-defining layer 119, the main pixel electrode, and the auxiliary pixel electrode 221a. Each of the first functional layer 222a and the second functional layer 222c may be integrally formed as a single body to entirely cover the main display area MDA and component area CA.

The first functional layer 222a may be a single layer or multiple layers. For example, when the first functional layer 222a is formed of a polymer material, the first functional layer 222a is a hole transport layer (HTL) having a single layer structure and may include poly-(3,4)-ethylene-dihydroxy thiophene (PEDOT) or polyaniline. When the first functional layer 222a is formed of a low-molecular weight material, the first functional layer 222a may include a hole injection layer (HIL) and the HTL.

The second functional layer 222c may be optional. For example, when the first functional layer 222a is formed of a polymer material, the second functional layer 222c may be located above the first functional layer 222a. The second functional layer 222c may be a single layer or multiple layers. The second functional layer 222c may include an electron transport layer (ETL) and/or an electron injection layer (EIL).

A main emission layer or auxiliary emission layer 222ab may be located on the first functional layer 222a or between the first functional layer 222a and second functional layer 222c. The main emission layer may have a shape patterned to correspond to the main pixel electrode, and the auxiliary emission layer 222ab may have a shape patterned to correspond to the auxiliary pixel electrode 221a. The main emission layer and the auxiliary emission layer 222ab may include an organic material. The main emission layer and the auxiliary emission layer 222ab may include a polymer organic material or low-molecular weight organic material emitting light of a certain color.

An auxiliary opposing electrode 223a overlapping the auxiliary pixel electrode 221a is located on the auxiliary emission layer 222ab, and a main opposing electrode overlapping the main pixel electrode is located on the main emission layer. The auxiliary opposing electrode 223a and the main opposing electrode may be integrally formed as a single body. The auxiliary opposing electrode 223a and the main opposing electrode may include a conductive material with a relatively low work function. For example, the auxiliary opposing electrode 223a and the main opposing electrode may include a (semi-)transparent layer including Ag, Mg, Al, Ni, Cr, Li, Ca, or an alloy thereof. The auxiliary opposing electrode 223a and the main opposing electrode may further include a layer including ITO, IZO, ZnO, or $In_2O_3$, on the (semi-) transparent layer including such a material. According to some embodiments, the auxiliary opposing electrode 223a and the main opposing electrode may include Ag and Mg.

The auxiliary pixel electrode 221a, the auxiliary emission layer 222ab, and the auxiliary opposing electrode 223a, which are sequentially stacked, may form a light-emitting diode, for example, the organic light-emitting diode OLED. A stacked structure of the main pixel electrode, the main emission layer, and the main opposing electrode may also form a light-emitting diode, for example, the organic light-emitting diode OLED. The organic light-emitting diode OLED may emit a red, green, or blue light, and an emission region of each organic light-emitting diode OLED may correspond to pixels. For example, the main sub-pixels Pm correspond to an emission area of the organic light-emitting diode OLED arranged in the main display area MDA, and the auxiliary sub-pixels Pa correspond to an emission area of the organic light-emitting diode OLED arranged in the component area CA. Because the opening 1190P of the pixel-defining layer 119 defines a size and/or width of the emission area, sizes and/or widths of the main sub-pixels Pm and auxiliary sub-pixels Pa may be dependent on the corresponding opening 1190P of the pixel-defining layer 119.

As described above, the organic light-emitting diode OLED may be covered by the first inorganic encapsulation layer 310, the second inorganic encapsulation layer 330, and the organic encapsulation layer 320 therebetween. A capping layer 250 including an organic material may be interposed between the auxiliary opposing electrode 223a and the thin-film encapsulation layer 300 and/or between the main opposing electrode and the thin-film encapsulation layer 300. The capping layer 250 may protect the auxiliary opposing electrode 223a and/or the main opposing electrode and may improve light extraction efficiency. The capping layer 250 may include an organic material having a higher refractive index than a refractive index of the auxiliary opposing electrode 223a and/or the main opposing electrode. Alternatively, the capping layer 250 may include layers having different refractive indexes from each other. For example, the capping layer 250 may include a high refractive index layer, a low refractive index layer, and a high refractive index layer, that are sequentially stacked. In this case, a refractive index of the high refractive index layer may be equal to or greater than 1.7, and a refractive index of the low refractive index layer may be equal to or less than 1.3.

Referring to the transmissive area TA of FIG. 6, insulating layers on the substrate 100 may each include a hole formed in the transmissive area TA. For example, as shown in FIG. 6, the gate insulating layer 112, the first interlayer insulating layer 113, the second interlayer insulating layer 115, the first planarization layer 117, the second planarization layer 118, and the pixel-defining layer 119 may respectively include first through sixth holes H1 through H6 overlapping each other and located in the transmissive area TA. In this case, the first functional layer 222a may be located on the buffer layer 111.

The first functional layer 222a and the second functional layer 222c may cover the transmissive area TA. On the other hand, the auxiliary opposing electrode 223a may include an opening 223aH formed in the transmissive area TA to increase transmittance in the transmissive area TA. The openings 223aH of the auxiliary opposing electrode 223a may correspond to the opening portions BMLA of the rear metal layer BML.

Such an opening 223aH of the auxiliary opposing electrode 223a may be formed by irradiating a laser beam. In other words, the auxiliary opposing electrode 223a may be formed to cover the transmissive area TA, and then a laser beam may be irradiated on a portion of the auxiliary opposing electrode 223a corresponding to the transmissive area TA to be removed, thereby forming the opening 223aH of the auxiliary opposing electrode 223a. During such a process, by irradiating the laser beam on the rear metal layer BML through the substrate 100, the laser beam may be irradiated on the portion of the auxiliary opposing electrode 223a corresponding to the opening portions BMLA of the rear metal layer BML, and thus the openings 223aH of the auxiliary opposing electrode 223a may be formed. In addition, while the laser beam is irradiated, the rear metal layer BML may shield the laser beam so as to effectively prevent the organic light-emitting diode OLED located thereon from being damaged by the laser beam or reduce the instances of the damage of the organic light-emitting diode OLED. In this regard, the rear metal layer BML may be referred to as a shielding layer.

The laser beam is irradiated on the opening portions BMLA of the rear metal layer BML, and when the laser beam penetrates the opening portions BMLA of the rear metal layer BML, a width of the laser beam may be slightly increased due to diffraction or the like. Accordingly, an area of a transmissive area TA' defined by each of the openings 223aH of the auxiliary opposing electrode 223a may be slightly wider than an area of the transmissive area TA defined by the corresponding opening portion BMLA of the rear metal layer BML as shown in FIG. 6, when viewed in a direction perpendicular to the substrate 100. In some cases, the area of the transmissive area TA' defined by each of the openings 223aH of the auxiliary opposing electrode 223a may be the same as the area of the transmissive area TA defined by the corresponding opening portion BMLA of the rear metal layer BML.

A portion of the auxiliary opposing electrode 223a where the laser beam has been irradiated is removed while the laser beam is irradiated, but a portion of the rear metal layer BML where the laser beam has been irradiated should not be removed. Accordingly, a melting point of a material included in the rear metal layer BML that is a shielding layer needs to be higher than a melting point of a material included in the auxiliary opposing electrode 223a. For example, the rear metal layer BML may include Mo, Cu, and/or Ti. The rear metal layer BML may be formed by selecting a material having a higher melting point than materials included in the auxiliary opposing electrode 223a, from among these materials.

As described above, the auxiliary pixel electrode 221a located in the component area CA is electrically connected to the auxiliary thin-film transistor TFTa located in the peripheral area NDA via the connecting wire TWL. The connecting wire TWL includes a thin portion, and the thin portion is connected to the auxiliary pixel electrode 221a and has a thickness thinner than a thickness of the auxiliary pixel electrode 221a. Hereinafter, a method of forming the auxiliary pixel electrode 221a and connecting wire TWL will be described with reference to FIGS. 8A through 8D.

Figure 8A:
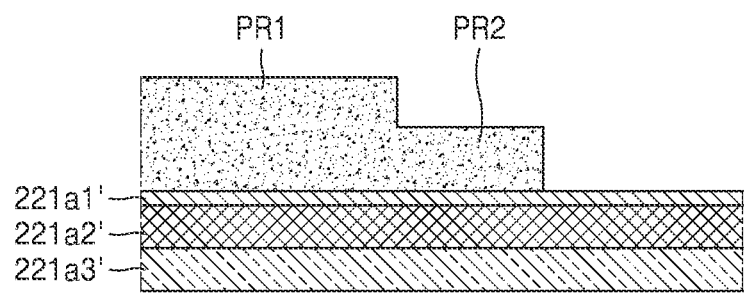
FIGS. 8A through 8D are cross-sectional views schematically showing processes of manufacturing a portion of a display apparatus of the disclosure.

First, as shown in FIG. 8A, a lowermost layer 221a3' in a direction (−z direction) of the substrate 100, an intermediate layer 221a2' on the lowermost layer 221a3', and an uppermost layer 221a1' on the intermediate layer 221a2' are formed to approximately correspond to an entire surface of the substrate 100. Then, a first photoresist PR1 and a second photoresist PR2 are formed on the uppermost layer 221a1'. Here, the first photoresist PR1 and the second photoresist PR2 cover portions where the main pixel electrode, the auxiliary pixel electrode 221a, and the connecting wire TWL are to be located. In detail, the first photoresist PR1 that is greater (i.e., thicker) than the second photoresist PR2 is located on the uppermost layer 221a1' to correspond to the portions where the main pixel electrode and the auxiliary pixel electrode 221a are to be formed. The second photoresist PR2 that is less (i.e., thinner) than the first photoresist PR1 is located on the uppermost layer 221a1' to correspond to the portion where the connecting wire TWL is to be formed.

The first photoresist PR1 and second photoresist PR2 having different thicknesses may be simultaneously (or concurrently) formed. For example, the first photoresist PR1 and second photoresist PR2 having different thicknesses may be simultaneously (or concurrently) formed by forming a photoresist material on the uppermost layer 221a1', irradiating light of different intensities on regions where the first photoresist PR1 and second photoresist PR2 are to be formed by using a halftone mask, and then developing the photoresist material and removing portions.

Figure 8B:
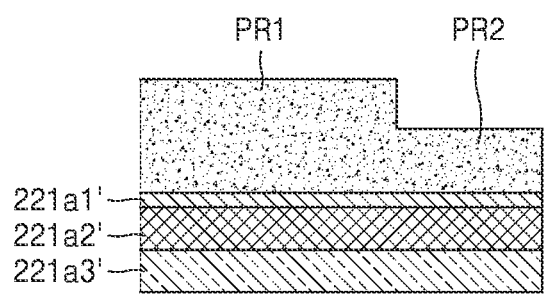
Figure 8C:
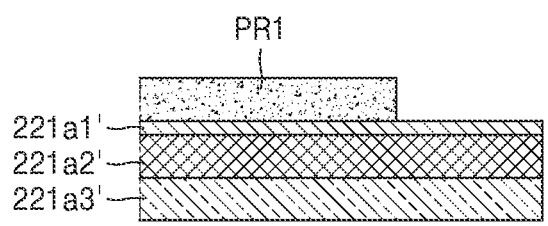

When etching is performed via a method, such as wet etching in such a state, portions of the lowermost layer 221a3', intermediate layer 221a2', and uppermost layer 221a1', which are not covered by the first photoresist PR1 or second photoresist PR2, are removed as shown in FIG. 8B. Also, the second photoresist PR2 having the thin thickness may be removed as shown in FIG. 8C by using a general photoresist removing method. During this process, a portion of the first photoresist PR1 is also removed. However, unlike the second photoresist PR2, the first photoresist PR1 is sufficiently thick, and thus even though the thickness of the first photoresist PR1 is decreased, the first photoresist PR1 is still located on the uppermost layer 221a1' corresponding to the portion where the main pixel electrode and auxiliary pixel electrode 221a are to be formed, as shown in FIG. 8C.

Figure 8D:
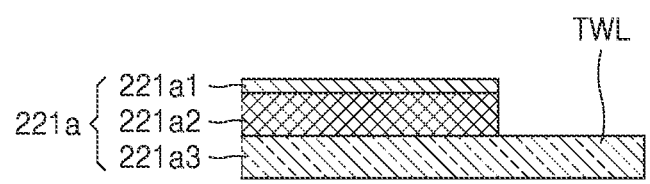

The uppermost layer 221a1' and intermediate layer 221a2', where the first photoresist PR1 is not covered, are removed and the lowermost layer 221a3' is remained by performing etching, such as wet etching, in the state shown in FIG. 8C, thereby simultaneously (or concurrently) forming the auxiliary pixel electrode 221a including a lowermost layer 221a3, an intermediate layer 221a2, and an uppermost layer 221a1, a main pixel electrode having a same structure, and the connecting wire TWL, as shown in FIG. 8D.

Here, the removing of the uppermost layer 221a1' and intermediate layer 221a2', which are not covered by the first photoresist PR1, and leaving of the lowermost layer 221a3' by performing the etching, such as wet etching, in the state shown in FIG. 8C may be performed by using an etch rate difference between the intermediate layer 221a2' and lowermost layer 221a3'. In other words, the uppermost layer 221a1' and intermediate layer 221a2', which are not covered by the first photoresist PR1, may be removed and the lowermost layer 221a3' may be remained by setting an etch rate of the lowermost layer 221a3' to be less than an etch rate of the intermediate layer 221a2' located on the lowermost layer 221a3', and ending an etching process before the lowermost layer 221a3' having a low etch rate is completely etched after the intermediate layer 221a2' having a high etch rate is etched and removed. According to some embodiments, the uppermost layer 221a1' not covered by the first photoresist PR1 may be etched before the intermediate layer 221a2' is etched.

As such, because the main pixel electrode, the auxiliary pixel electrode 221a, and the connecting wire TWL are formed simultaneously (or concurrently) via a same process, manufacturing efficiency of a display apparatus may be significantly increased.

A portion indicated by the connecting wire TWL in FIG. 8D may be the thin portion described above. The thin portion of the connecting wire TWL is connected to the auxiliary pixel electrode 221a and has a thickness less than that of the auxiliary pixel electrode 221a. Also, as described above, when the thin portion of the connecting wire TWL is formed, the thin portion of the connecting wire TWL and the auxiliary pixel electrode 221a may include a same material. For example, the thin portion of the connecting wire TWL and at least one of multiple layers of the auxiliary pixel electrode 221a may include a same material. For example, the thin portion of the connecting wire TWL and one of multiple layers of the auxiliary pixel electrode 221a may include a same material. In the embodiments described with reference to FIGS. 8A through 8D, the thin portion of the connecting wire TWL and the lowermost layer 221a3 that is one of the multiple layers of the auxiliary pixel electrode 221a include a same material. For example, the thin portion of the connecting wire TWL and one of multiple layers of the auxiliary pixel electrode 221a may be integrally formed as a single body. In addition, as shown in FIG. 8D, the connecting wire TWL and the lowermost layer 221a3 that is one of the multiple layers of the auxiliary pixel electrode 221a may be integrally formed as a single body. For example, specifically, as shown in FIGS. 6 and 8D, the thin portion of the connecting wire TWL and the lowermost layer 221a3 of multiple layers of the auxiliary pixel electrode 221a in a direction to the substrate 100 may be integrally formed as a single body.

The connecting wire TWL may include a transparent conductive material such that the area of the transmissive area TA is greatest in the component area CA. In other words, the lowermost layer 221a3 may include a transparent conductive material. The intermediate layer 221a2 on the lowermost layer 221a3 may include a reflective metal such that the auxiliary pixel electrode 221a becomes a reflective electrode. Meanwhile, as described above, the etch rate of the lowermost layer 221a3 needs to be lower than the etch rate of the intermediate layer 221a2. In this regard, the lowermost layer 221a3 may include a conductive oxide and the intermediate layer 221a2 located on the lowermost layer 221a3 may include Ag or Al. The conductive oxide may be ITO, IZO, AZO, or GZO.

Because the uppermost layer 221a1 of the auxiliary pixel electrode 221a contacts the first functional layer 222a, such as the hole injection layer or hole transport layer, the uppermost layer 221a1 of the auxiliary pixel electrode 221a and the lowermost layer 221a3 of the auxiliary pixel electrode 221a may include a same material in consideration of an energy level of the auxiliary pixel electrode 221a and an energy level of the first functional layer 222a. For example, the uppermost layer 221a1 may include a conductive oxide, such as ITO, IZO, AZO, or GZO, like the lowermost layer 221a3.

Here, the thickness of the lowermost layer 221a3 may be greater than the thickness of the uppermost layer 221a1. In detail, the uppermost layer 221a1 may have a thickness of about 70 Å and the lowermost layer 221a3 may have a thickness between 100 Å and 2,000 Å. In other words, the thickness of the lowermost layer 221a3 may be equal to or greater than 100 Å and less than or equal to 2,000 Å. The connecting wire TWL and the lowermost layer 221a3 may be integrally formed as a single body, and when the thickness of the lowermost layer 221a3 is less than 100 Å, resistance of the connecting wire TWL rapidly increases, and thus the thickness of the lowermost layer 221a3 needs to be equal to or greater than 100 Å. On the other hand, when the thickness of the lowermost layer 221a3 is greater than 2,000 Å, the lowermost layer 221a3 may not be completely removed while removing the portions not covered by the first photoresist PR1 and second photoresist PR2. In this case, components that need to be insulated from each other may be electrically connected, thereby causing a defect. Accordingly, the thickness of the lowermost layer 221a3 needs to be equal to or less than 2,000 Å. For reference, the thickness of the intermediate layer 221a2 including Al or Ag may be between 800 Å and 1,000 Å.

In FIGS. 6 and 7, the thin portion of the connecting wire TWL extends up to an upper portion of the auxiliary thin-film transistor TFTa. In other words, in FIGS. 6 and 7, the connecting wire TWL includes only the thin portion. However, the disclosure is not limited thereto. In other words, the thin portion of the connecting wire TWL contacts the auxiliary pixel electrode 221a and has a shape extending to the peripheral area NDA, and the connecting wire TWL may include, in the peripheral area NDA, a thick portion. The thick portion and the thin portion may be arranged on a same layer. According to some embodiments, the connecting wire TWL may include, in the peripheral area NDA, a portion located on a layer different from the layer on which the thin portion is located.

Figure 9:
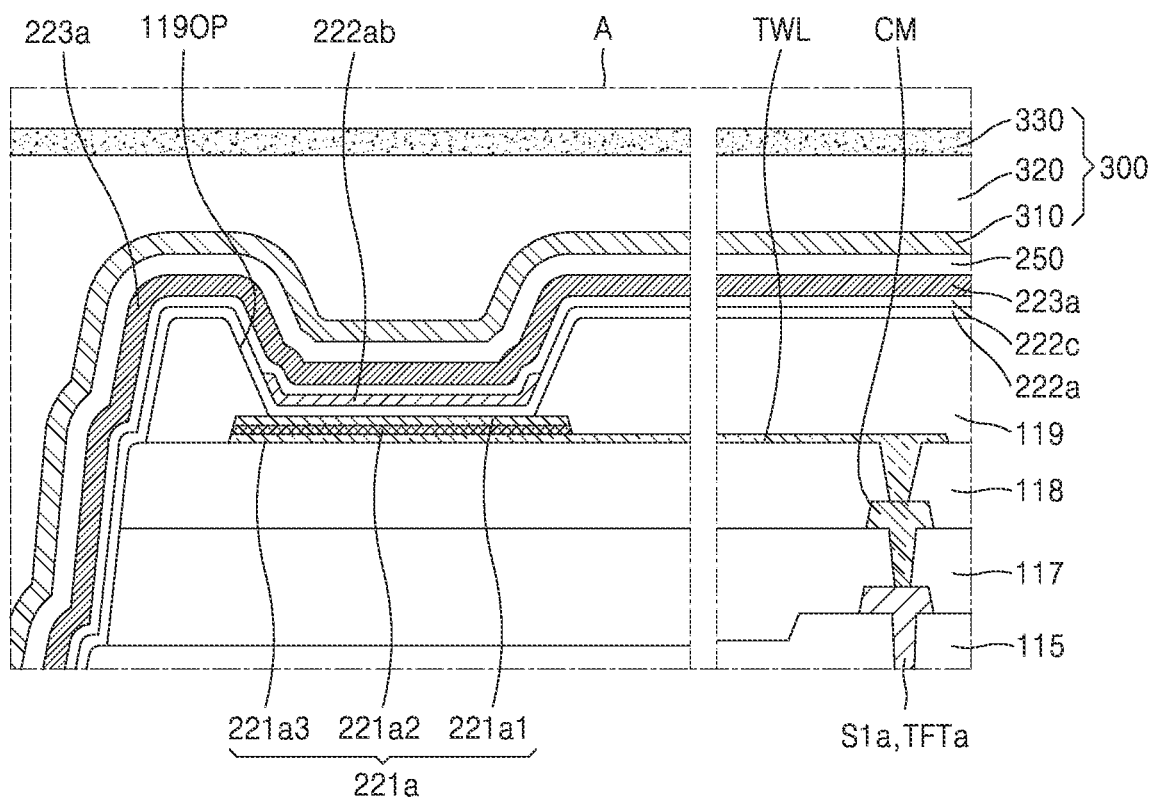
FIG. 9 is a cross-sectional view schematically showing a portion of a display apparatus, according to some embodiments of the disclosure.

In addition, a contact metal CM may be provided between the connecting wire TWL and auxiliary thin-film transistor TFTa as shown in FIG. 9 that is a cross-sectional view schematically showing a portion of a display apparatus, according to some embodiments of the disclosure. The contact metal CM is located on the first planarization layer 117 and may contact the auxiliary pixel circuit PCa via a contact hole formed in the first planarization layer 117. The contact metal CM may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single layer or multilayer structure including such a material. The second planarization layer 118 covers the contact metal CM and the connecting wire TWL may be connected to the contact metal CM via a contact hole formed in the second planarization layer 118. The contact metal CM may be considered as a part of the connecting wire TWL.

Figure 10:
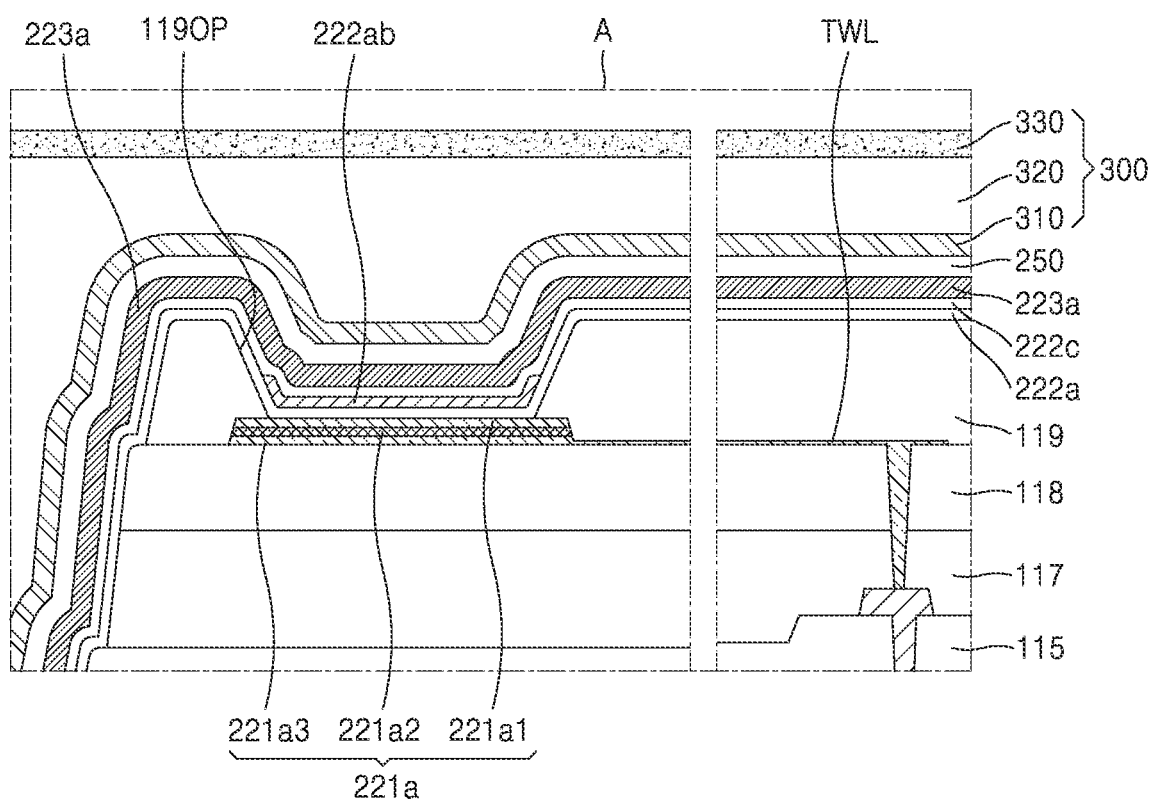
FIG. 10 is a cross-sectional view schematically showing a portion of a display apparatus, according to some embodiments of the disclosure.

As described above with reference to FIG. 8C, by removing the uppermost layer 221a1' and intermediate layer 221a2', which are not covered by the first photoresist PR1, and leaving the lowermost layer 221a3', the auxiliary pixel electrode 221a including the lowermost layer 221a3, the intermediate layer 221a2, and the uppermost layer 221a1, the main pixel electrode having a same structure, and the connecting wire TWL may be simultaneously (or concurrently) formed as shown in FIG. 8D. Here, the uppermost layer 221a1' and intermediate layer 221a2', which are not covered by the first photoresist PR1, may be removed and the lowermost layer 221a3' may be remained by ending an etching process before the lowermost layer 221a3' having a low etch rate is completely etched after the intermediate layer 221a2' having a high etch rate is etched and removed. During this process, a portion of the upper portion of the lowermost layer 221a3' may be removed. Accordingly, the thickness of the thin portion of the connecting wire TWL may be less than the thickness of the lowermost layer 221a3 of the auxiliary pixel electrode 221a as shown in FIG. 10 that is a cross-sectional view schematically showing a portion of a display apparatus, according to some embodiments of the disclosure.

Figure 11:
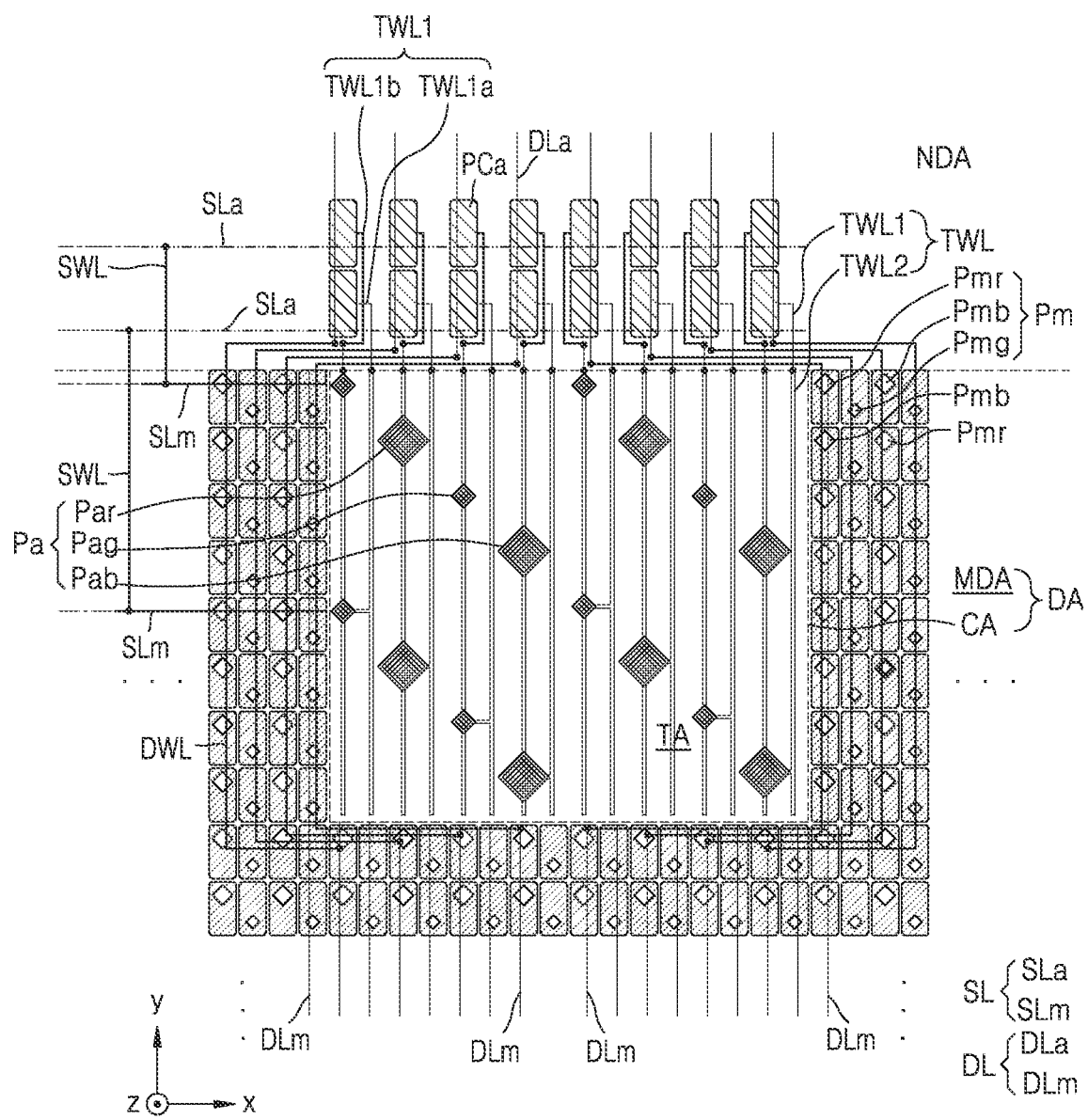
FIG. 11 is a plan layout view schematically showing a partial region of a display apparatus, according to some embodiments of the disclosure.

FIG. 11 is a plan layout view schematically showing a partial region of a display apparatus, according to some embodiments of the disclosure.

In FIG. 5, the connecting wire TWL is integrally formed as a single body throughout the upper peripheral area of the peripheral area NDA and the auxiliary sub-pixels Pa of the component area CA, but the disclosure is not limited thereto. For example, as shown in FIG. 11, the connecting wire TWL may include a first connecting wire TWL1 and a second connecting wire TWL2 including different materials.

The first connecting wire TWL1 may be a wire connected to the auxiliary pixel circuit PCa by being arranged in the peripheral area NDA. The first connecting wire TWL1 may include a conductive material including molybdenum (Mo), aluminum (Al), copper (Cu), or titanium (Ti), and may have a multilayer or single layer structure including the conductive material.

The plurality of first connecting wires TWL1 may be located between the auxiliary pixel circuits PCa. For example, the first connecting wire TWL1 may include a 1-1st connecting wire TWL1a and a 1-2nd connecting wire TWL1b arranged in different layers. The 1-1st connecting wire TWL1a and the data line DL of FIG. 6 may be on a same layer and may be formed of a same material. An insulating layer may be interposed between the 1-2nd connecting wire TWL1b and the 1-1st connecting wire TWL1a. For example, the 1-2nd connecting wire TWL1b and the contact metal CM of FIG. 9 may be located on a same layer and may be formed of a same material. The 1-1st connecting wire TWL1a and the 1-2nd connecting wire TWL1b may be located between the auxiliary pixel circuits PCa and may have a shape at least partially bent when viewed from a direction perpendicular to the substrate 100. There may be pluralities of 1-1st connecting wires TWL1a and 1-2nd connecting wires TWL1b located in different layers, and the 1-1st connecting wires TWL1a and the 1-2nd connecting wires TWL1b may be alternately arranged in a region between the plurality of auxiliary pixel circuits PCa.

The second connecting wire TWL2 may be a wire arranged in the component area CA and connected to the first connecting wire TWL1 at an edge of the component area CA. The second connecting wire TWL2 may include a transparent conductive material. In other words, the second connecting wire TWL2 may be formed of a same material and in a same structure as the connecting wire TWL according to the embodiments described above.

The first connecting wire TWL1 and the second connecting wire TWL2 may be located on a same layer or on different layers. When the first connecting wire TWL1 and the second connecting wire TWL2 are located on different layers, the first connecting wire TWL1 and second connecting wire TWL2 may be connected to each other via a contact hole.

Conductivity of the first connecting wire TWL1 may be higher than conductivity of the second connecting wire TWL2. Because the first connecting wire TWL1 is arranged in the upper peripheral area of the peripheral area NDA, it is not required to secure light transmittance, and thus the first connecting wire TWL1 may employ a material having higher conductivity but lower light transmittance than the second connecting wire TWL2. Accordingly, a resistance value of the connecting wire TWL may be reduced.

As shown in FIG. 11, lengths of the plurality of second connecting wires TWL2 may be the same. For example, ends of the plurality of second connecting wires TWL2 may extend up to a boundary of the component area CA at an opposite side where the auxiliary pixel circuits PCa are arranged. This is to match an electric load by the second connecting wire TWL2. Accordingly, luminance deviation in the component area CA may be reduced. The number of second connecting wires TWL2 of the component area CA may be the same as the number of auxiliary pixel circuits PCa.

According to some embodiments of the present disclosure as described above, a display apparatus in which light transmittance in a partial region is increased may be implemented. However, the scope of embodiments according to the present disclosure are not limited by such effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:
a substrate comprising a main display area, a component area, and a peripheral area;
a main pixel electrode at the main display area of the substrate;
a main thin-film transistor at the main display area of the substrate and electrically connected to the main pixel electrode;
an auxiliary pixel electrode at the component area of the substrate;
an auxiliary thin-film transistor at the peripheral area of the substrate; and
a connecting wire connected to the auxiliary pixel electrode and including a thin portion having a thickness less than a thickness of the auxiliary pixel electrode,
wherein the connecting wire electrically connects the auxiliary thin-film transistor to the auxiliary pixel electrode.

2. The display apparatus of claim 1, wherein the thin portion of the connecting wire and the auxiliary pixel electrode comprise a same material.

3. The display apparatus of claim 1, wherein the auxiliary pixel electrode includes multiple layers, and the thin portion of the connecting wire and at least one of the multiple layers of the auxiliary pixel electrode include a same material.

4. The display apparatus of claim 1, wherein the auxiliary pixel electrode includes multiple layers, and the thin portion of the connecting wire and one of the multiple layers of the auxiliary pixel electrode include a same material.

5. The display apparatus of claim 1, wherein the auxiliary pixel electrode includes multiple layers, and the thin portion of the connecting wire and one of the multiple layers of the auxiliary pixel electrode are integrally formed as a single body.

6. The display apparatus of claim 1, wherein the auxiliary pixel electrode includes multiple layers, and the thin portion of the connecting wire and a lowermost layer of the multiple layers of the auxiliary pixel electrode in a direction to the substrate are integrally formed as a single body.

7. The display apparatus of claim 6, wherein an etch rate of the lowermost layer of the auxiliary pixel electrode is less than an etch rate of a layer of the auxiliary pixel electrode, the layer being on the lowermost layer.

8. The display apparatus of claim 7, wherein the lowermost layer of the auxiliary pixel electrode includes ITO, IZO, AZO, or GZO, and the layer of the auxiliary pixel electrode on the lowermost layer of the auxiliary pixel electrode includes Ag or Al.

9. The display apparatus of claim 7, wherein the lowermost layer of the auxiliary pixel electrode includes a transparent conductive material, and the layer of the auxiliary pixel electrode on the lowermost layer of the auxiliary pixel electrode includes a metal.

10. The display apparatus of claim 7, wherein the lowermost layer of the auxiliary pixel electrode includes a conductive oxide, and the layer of the auxiliary pixel electrode on the lowermost layer of the auxiliary pixel electrode includes a metal.

11. The display apparatus of claim 6, wherein a thickness of the thin portion of the connecting wire is less than a thickness of the lowermost layer of the auxiliary pixel electrode.

12. The display apparatus of claim 6, wherein the auxiliary pixel electrode includes the lowermost layer, an intermediate layer on the lowermost layer, and an uppermost layer on the intermediate layer, and
a thickness of the lowermost layer is greater than a thickness of the uppermost layer.

13. The display apparatus of claim 12, wherein the thickness of the lowermost layer is equal to or greater than 100 Å and less than or equal to 2,000 Å.

14. The display apparatus of claim 12, wherein the uppermost layer and the lowermost layer include a same material.

15. The display apparatus of claim 1, wherein the thin portion of the connecting wire extends up to an upper portion of the auxiliary thin-film transistor.

16. The display apparatus of claim 1, wherein the connecting wire includes only the thin portion.

* * * * *